(12) United States Patent
Kuroda et al.

(10) Patent No.: US 12,713,833 B2
(45) Date of Patent: Aug. 18, 2026

(54) PIEZOELECTRIC STACK, METHOD OF MANUFACTURING PIEZOELECTRIC STACK, AND PIEZOELECTRIC ELEMENT

(71) Applicant: SUMITOMO CHEMICAL COMPANY, LIMITED, Tokyo (JP)

(72) Inventors: Toshiaki Kuroda, Hitachi (JP); Kenji Shibata, Hitachi (JP); Kazutoshi Watanabe, Hitachi (JP); Takeshi Kimura, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 897 days.

(21) Appl. No.: 17/917,055

(22) PCT Filed: Feb. 24, 2021

(86) PCT No.: PCT/JP2021/006769
§ 371 (c)(1),
(2) Date: Oct. 5, 2022

(87) PCT Pub. No.: WO2021/205768
PCT Pub. Date: Oct. 14, 2021

(65) Prior Publication Data

US 2023/0142065 A1 May 11, 2023
US 2023/0276711 A2 Aug. 31, 2023

(30) Foreign Application Priority Data

Apr. 6, 2020 (JP) ................................ 2020-068252

(51) Int. Cl.
*B06B 1/06* (2006.01)
*B06B 1/02* (2006.01)
(Continued)

(52) U.S. Cl.
CPC ........... *H10N 39/00* (2023.02); *B06B 1/0261* (2013.01); *H10N 30/20* (2023.02); *H10N 30/88* (2023.02); *B06B 1/0622* (2013.01)

(58) Field of Classification Search
CPC ........................... B06B 1/0261; B06B 1/0622
(Continued)

(56) References Cited

U.S. PATENT DOCUMENTS

2018/0069168 A1 3/2018 Ikeuchi et al.
2019/0255568 A1 8/2019 Kojima et al.
(Continued)

FOREIGN PATENT DOCUMENTS

CN 107194345 A 9/2017
JP 2018-170343 A 11/2018
(Continued)

OTHER PUBLICATIONS

International Searching Authority, "International Search Report," issued in connection with International Patent Application No. PCT/JP2021/006769, dated Jun. 1, 2021.
(Continued)

*Primary Examiner* — Derek J Rosenau
(74) *Attorney, Agent, or Firm* — Foley & Lardner LLP

(57) ABSTRACT

There is provided a piezoelectric stack, including: a substrate; an output-side bottom electrode film on the substrate; an output-side piezoelectric film, being an oxide film, on the output-side bottom electrode film; an output-side top electrode film on the output-side piezoelectric film; an input-side bottom electrode film on the substrate; an input-side piezoelectric film, being a nitride film, on the input-side bottom electrode film; an input-side top electrode film on the input-side piezoelectric film; and an ultrasonic output part and ultrasonic input part placed in such a manner as not overlapping each other when viewed from a top surface of
(Continued)

the substrate, the ultrasonic output part comprising a stacked part of the output-side bottom electrode film, the output-side piezoelectric film, and the output-side top electrode film, the ultrasonic input part comprising a stacked part of the input-side bottom electrode film, the input-side piezoelectric film, and the input-side top electrode film.

13 Claims, 8 Drawing Sheets

(51) Int. Cl.
*H10N 30/20* (2023.01)
*H10N 30/88* (2023.01)
*H10N 39/00* (2023.01)

(58) Field of Classification Search
USPC .......................................... 310/322, 334, 335
See application file for complete search history.

(56) References Cited

U.S. PATENT DOCUMENTS

| | | | | |
|---|---|---|---|---|
| 2020/0055088 | A1 | 2/2020 | Okada | |
| 2021/0137497 | A1* | 5/2021 | Bryzek | G01S 15/8938 |

FOREIGN PATENT DOCUMENTS

| | | | |
|---|---|---|---|
| JP | 2019-117943 | A | 7/2019 |
| JP | 2019-146020 | A | 8/2019 |
| JP | 2019-165307 | A | 9/2019 |
| WO | WO-2016/175013 | A1 | 11/2016 |
| WO | WO-2018/155276 | A1 | 8/2018 |
| WO | WO-2019/058978 | A1 | 3/2019 |

OTHER PUBLICATIONS

International Searching Authority, “Written Opinion,” issued in connection with International Patent Application No. PCT/JP2021/006769, dated Jun. 1, 2021.

Office Action issued in corresponding Taiwanese Patent Application No. 110110572 dated Jul. 3, 2024 (6 pages).

European Extended Search Report issued in corresponding European Patent Application No. 21785614.5 dated Mar. 27, 2024 (7 pages).

International Preliminary Report on Patentability, dated Oct. 20, 2022, which includes an English-language Translation of the Written Opinion issued in the corresponding International Patent Application No. PCT/JP2021/006769, dated Jun. 1, 2021.

* cited by examiner 10a
2
6
1

10b
3A
2
6
1

10c
3A
2
6
1

10d
3A
12
2
6
1

10e
3A
3B
12
3B
2
6
1

10f
3A
3B
2
6
1

40a
2A
6
1

40b
3A
2A
6
1

3A
12
40c
2A
6
1

3A 2B
40d
12
2A
6
1
2B 3A
3B
40e
2B
12
2A
6
1
3B
2B 40f
3A
2B 3B
2A
6
1

42a
2
6
1

42b
3A
2
6
1

42c
12
2
6
1
3A 42d
3B
12
3B
2
6
1
3A 42e
3B
3A
2
6
1

PIEZOELECTRIC STACK, METHOD OF MANUFACTURING PIEZOELECTRIC STACK, AND PIEZOELECTRIC ELEMENT

CROSS-REFERENCE TO RELATED APPLICATIONS

The present application claims priority under 37 U.S.C. § 371 to International Patent Application No. PCT/JP2021/006769, filed Feb. 24, 2021, which claims priority to and the benefit of Japanese Patent Application No. 2020-068252, filed on Apr. 6, 2020. The contents of these applications are hereby incorporated by reference in their entireties.

TECHNICAL FIELD

The present disclosure relates to a piezoelectric stack, a method of manufacturing a piezoelectric stack, and a piezoelectric element.

DESCRIPTION OF RELATED ART

Piezoelectric materials are used in an ultrasonic sensor of a p-MUT (Piezoelectric Micromachined Ultrasonic Transducer), for example. Widely used piezoelectric materials include a lead-zirconium-titanium oxide-based (PZT-based) ferroelectric (see Patent Document 1, for example). A potassium sodium niobium oxide-based (KNN-based) ferroelectric or aluminum nitride (AlN) is also sometimes used as a piezoelectric material used in ultrasonic sensors or the like (see Patent Document 2, for example). In recent years, there is a demand to further improve a performance in ultrasonic sensors including a piezoelectric material.

PRIOR ART DOCUMENT

Patent Document

Patent Document 1: Japanese Patent Laid Open Publication No. 2019-146020

Patent Document 2: Japanese Patent Laid Open Publication No. 2019-165307

SUMMARY

Problem to be Solved by Disclosure

According to the present disclosure, there is provided a piezoelectric stack and the like that enable providing an ultrasonic sensor having a high performance.

Means for Solving Problem

According to an aspect of the present disclosure, there is provided a piezoelectric stack, a piezoelectric element, and an ultrasonic sensor, each including:

- a substrate;
- an output-side bottom electrode film on the substrate;
- an output-side piezoelectric film, being an oxide film, on the output-side bottom electrode film;
- an output-side top electrode film on the output-side piezoelectric film;
- an input-side bottom electrode film on the substrate;
- an input-side piezoelectric film, being a nitride film, on the input-side bottom electrode film;
- an input-side top electrode film on the input-side piezoelectric film; and

- an ultrasonic output part and an ultrasonic input part placed in such a manner as not overlapping each other when viewed from a top surface of the substrate,
  - the ultrasonic output part including a stacked part of the output-side bottom electrode film, the output-side piezoelectric film, and the output-side top electrode film,
  - the ultrasonic input part including a stacked part of the input-side bottom electrode film, the input-side piezoelectric film, and the input-side top electrode film.

According to another aspect of the prevention disclosure, there is provided a method of manufacturing a piezoelectric stack, including:

- depositing an output-side bottom electrode film and an input-side bottom electrode film on a substrate;
- depositing an output-side piezoelectric film, being an oxide film, on the output-side bottom electrode film;
- depositing a protective film that protects the output-side piezoelectric film;
- depositing an input-side piezoelectric film, being a nitride film, on the input-side bottom electrode film;
- exposing the output-side piezoelectric film by removing the protective film by etching; and
- depositing an output-side top electrode film on the output-side piezoelectric film and depositing an input-side top electrode film on the input-side piezoelectric film, thereby
- producing a stack in which an ultrasonic output part and an ultrasonic input part are placed in such a manner as not overlapping each other when viewed from a top surface of the substrate,
  - the ultrasonic output part including a stacked part of the output-side bottom electrode film, the output-side piezoelectric film, and the output-side top electrode film,
  - the ultrasonic input part including a stacked part of the input-side bottom electrode film, the input-side piezoelectric film, and the input-side top electrode film.

Advantage of Disclosure

According to the present disclosure, there is provided a piezoelectric stack and a piezoelectric element that enable providing an ultrasonic sensor having a high performance.

DETAILED DESCRIPTION OF THE DISCLOSURE

Embodiment of the Present Disclosure

An embodiment of the present disclosure will be described hereinafter, with reference to FIGS. 1 to 4(*f*).

(1) CONFIGURATION OF PIEZOELECTRIC STACK

Figure 1:
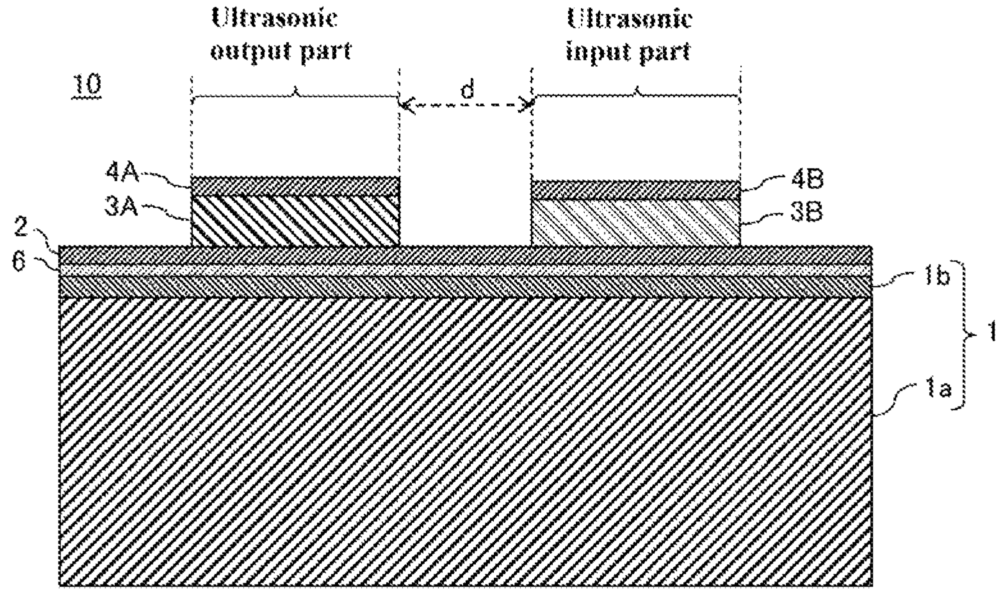
FIG. 1 is a view illustrating an example of a cross-sectional structure of a piezoelectric stack according to an embodiment of the present disclosure.

As illustrated in FIG. 1, a stack (stacked substrate) 10 (hereinafter also referred to as a piezoelectric stack 10) having a piezoelectric film according to the present embodiment includes a substrate 1, a bottom electrode film 2 provided (deposited) on the substrate 1, an output-side piezoelectric film 3A provided (deposited) on the bottom electrode film 2, an output-side top electrode film 4A provided (deposited) on the output-side piezoelectric film 3A, an input-side piezoelectric film 3B provided (deposited) on the bottom electrode film 2, and an input-side top electrode film 4B provided (deposited) on the input-side piezoelectric film 3B. In the present embodiment, the bottom electrode film 2 functions as the output-side bottom electrode film 2A and also functions as the input-side bottom electrode film 2B.

Figure 2:
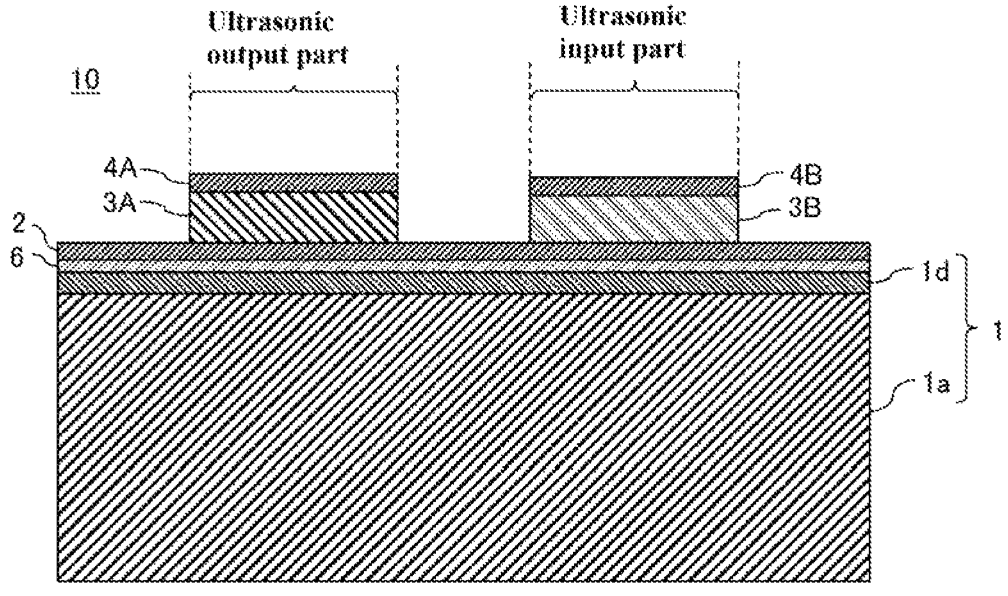
FIG. 2 is a view illustrating a modified example of the cross-sectional structure of the piezoelectric stack according to the embodiment of the present disclosure.

The substrate 1 can suitably be a single-crystal silicon (Si) substrate 1*a* on which a surface oxide film ($SiO_2$-film) 1*b* such as a thermal oxide film or a CVD (Chemical Vapor Deposition) oxide film is formed, i.e., a Si-substrate having the surface oxide film. Alternatively, the substrate 1 can be a Si-substrate 1*a* having an insulating film 1*d* formed on a surface thereof, the insulating film 1*d* containing an insulating material other than $SiO_2$, as illustrated in FIG. 2. Alternatively, the substrate 1 can be the Si-substrate 1*a* in which Si-(100), Si-(111), or the like, is exposed on the surface thereof, i.e., a Si-substrate not having the surface oxide film 1*b* or the insulating film 1*d*. Alternatively, the substrate 1 can be an SOI (Silicon-On-Insulator) substrate, a quartz glass ($SiO_2$) substrate, a gallium arsenide (GaAs) substrate, a sapphire ($Al_2O_3$) substrate, or a metal substrate containing a metallic material such as stainless steel (SUS). A thickness of the single-crystal Si-substrate 1*a* can be, for example, 300 μm or more and 1000 μm or less, and a thickness of the surface oxide film 1*b* can be, for example, 1 nm or more and 4000 nm or less.

The bottom electrode film 2 can be deposited using platinum (Pt), for example. The bottom electrode film 2 is a single-crystal film or a polycrystalline film (hereinafter collectively also referred to as a Pt-film). Preferably, crystals constituting the Pt-film are preferentially oriented in (111) direction with respect to the surface of the substrate 1. That is, a surface of the bottom electrode film (Pt-film) 2 (a surface to be a base of the output-side piezoelectric film 3A) is preferably mainly constituted of Pt-(111). The Pt-film can be deposited using a method such as a sputtering method or a vapor deposition method. The bottom electrode film 2 can also be deposited using, in place of Pt, various metals such as gold (Au), ruthenium (Ru), or iridium (Ir); alloys containing these as main components; metal oxides such as strontium ruthenium oxide ($SrRuO_3$; abbreviated as SRO) or lanthanum nickel oxide ($LaNiO_3$; abbreviated as LNO); or the like. The bottom electrode film 2 may also be a single-layer film deposited using the above-listed various metals or metal oxides; a stack including a Pt-film and a film containing LNO provided on the Pt-film; a stack including a Pt-film and a film containing SRO provided on the Pt-film; or the like. A thickness of the bottom electrode film 2 can be, for example, 100 nm or more and 400 nm or less.

An adhesion layer 6 mainly containing, for example, titanium (Ti), tantalum (Ta), titanium oxide ($TiO_2$), nickel (Ni), ruthenium oxide ($RuO_2$), iridium oxide ($IrO_2$), or the like may also be provided between the substrate 1 and the bottom electrode film 2 in order to enhance an adhesiveness between them. The adhesion layer 6 can be deposited using a method such as a sputtering method or a vapor deposition method. A thickness of the adhesion layer 6 can be, for example, 1 nm or more and 200 nm or less.

The output-side piezoelectric film 3A is a film containing oxygen (O) and not containing nitrogen (N). That is, the output-side piezoelectric film 3A is an oxide film. The term "film not containing N" used herein includes not only a film containing no N at all, but also a film containing a small amount of N as unavoidable impurities. The output-side piezoelectric film 3A is preferably a film having a high piezoelectric constant. Thereby, the output-side piezoelectric film 3A can be largely deformed when applying a predetermined voltage using a later-described voltage applicator 11*a*, which in turn largely vibrate a later-described output-side vibration part. As a result, an intensity of ultrasonic waves transmitted from a later-described ultrasonic output part can be increased, and a vibration depth of ultrasonic waves in a test object can be increased. The piezoelectric constant of the output-side piezoelectric film 3A can be, for example, 100 pm/V or more, and preferably 170 pm/V or more. An upper limit of the piezoelectric constant of the output-side piezoelectric film 3A is not particularly limited, but the upper limit thereof is about 200 pm/V in a current technology. Also, the output-side piezoelectric film 3A preferably has a higher piezoelectric constant than that of the input-side piezoelectric film 3B.

The output-side piezoelectric film 3A can be deposited using, for example, an alkali niobium oxide which contains potassium (K), sodium (Na), and niobium (Nb), and which is represented by a composition formula $(K_{1-x}Na_x)_yNbO_3$. That is, the output-side piezoelectric film 3A can be deposited using potassium sodium niobium oxide (KNN). A coefficient x[=Na/(K+Na)] in the above composition formula is a value in a range of $0<x<1$. Preferably, the coefficient x in the above composition formula is in the range of $0<x<1$, and a coefficient y[=(K+Na)/Nb] is a value in a range of $0.7 \le y \le 1.50$. The output-side piezoelectric film 3A is a polycrystalline film of KNN (hereinafter also referred to as a KNN-film 3A). A crystal structure of KNN is a perovskite structure. The KNN-film 3A can be deposited using a method such as a sputtering method, a PLD (Pulsed Laser Deposition) method, or a sol-gel method. A thickness of the KNN-film 3A can be, for example, 0.5 μm or more and 5 μm or less.

Preferably, crystals constituting the KNN-film 3A are preferentially oriented in (001) direction with respect to the surface of the substrate 1 (a surface of the Si-substrate 1*a*, in a case where the substrate 1 is, for example, the Si-substrate 1*a* having the surface oxide film 1*b*, the insulating film 1*d*, or the like, hereinafter the same). That is, a surface of the KNN-film 3A (a surface to be a base of the output-side top electrode film 4A) is preferably mainly constituted of KNN-(001). By depositing the KNN-film 3A directly on the Pt-film preferentially oriented in (111) direction with respect to the surface of the substrate 1, the crystals constituting the KNN-film 3A can be easily preferentially oriented in (001) direction with respect to the surface of the substrate 1. For example, 80% or more crystals in a crystal group constituting the KNN-film 3A can be oriented in (001) direction with respect to the surface of the substrate, and 80% or more regions of the surface of the KNN-film 3 can be easily KNN-(001).

It is preferable that half or more crystals in the crystal group constituting the KNN-film 3A have a columnar structure. Also, boundaries between the crystals constituting the KNN-film 3A, i.e., crystal grain boundaries present in the KNN-film 3A preferably penetrate the KNN-film 3A in a thickness direction of the KNN-film 3A. For example, the KNN-film 3A has more crystal grain boundaries that penetrate the KNN-film 3A in the thickness direction thereof than crystal grain boundaries (e.g., crystal grain boundaries parallel to a planar direction of the substrate 1) that do not penetrate the KNN-film 3A in the thickness direction thereof.

Preferably, the KNN-film 3A contains at least one metal element (hereinafter also referred to simply as "metal element") selected from a group consisting of copper (Cu), manganese (Mn), iron (Fe), and vanadium (V). More preferably, the KNN-film 3A contains at least one metal element selected from a group of Cu and Mn. "Contains at least one metal element selected from the group of Cu and Mn" may include a case of containing only Cu, a case of containing only Mn, and a case of containing both Cu and Mn.

Preferably, the KNN-film 3A contains the above metal element at a concentration in a range of, for example, 0.2 at % or more and 2.0 at % or less relative to an amount of niobium (Nb) in the KNN-film 3A. That is, a concentration of the above metal element in the KNN-film 3A is preferably, for example, 0.2 at % or more and 2.0 at % or less. When the KNN-film 3A contains a plurality of the metal elements of Cu, Mn, Fe, and V, the concentration of the metal element indicates a total concentration of the plurality of the metal elements.

Since the concentration of the metal element in the KNN-film 3A is 0.2 at % or more, a resistance (etching resistance) to fluorine-based etchants can be improved while also improving an insulating property (leakage resistance) of the KNN-film 3A. Since the insulating property of the KNN-film 3A is improved, a higher voltage can be applied to the KNN-film 3A, using the later-described voltage applicator 11*a*. As a result, an amount of the deformation of the KNN-film 3A can be increased. Since the etching resistance of the KNN-film 3A is improved, i.e., since the KNN-film 3A is less likely to be etched, deteriorations in a piezoelectric performance and a quality of the KNN-film 3A can be suppressed in a production process of the piezoelectric stack 10.

Since the concentration of the metal element in the KNN-film 3A is 2.0 at % or less, a dielectric constant of the KNN-film 3A can be a value suitable for applications such as a vibrator for generating ultrasonic waves, and an increase in a power consumption can be suppressed when the KNN-film 3A is applied to the vibrator for generating ultrasonic waves, as described later.

The KNN-film 3A may also contain a secondary component other than K, Na, Nb, and the above metal element in a range where the effect obtained by adding the above metal element in a predetermined range is not impaired, e.g., in a range of 5 at % or less (in a case where a plurality of the secondary components are added, a total concentration is 5 at % or less). Examples of the secondary components include lithium (Li), Ta, and antimony (Sb).

The output-side top electrode film 4A (hereinafter also referred to as a top electrode film 4A) can be deposited using, for example, various metals such as Pt, Au, aluminum (Al), or Cu; or an alloy containing these metals. The top electrode film 4A can be deposited using a method such as a sputtering method, a vapor deposition method, a plating method, or a metal paste method. The top electrode film 4A does not greatly affect the crystal structure of the KNN-film 3A, unlike the bottom electrode film 2A. Therefore, there are no particular limitations on a material and a crystal structure of the top electrode film 4A, and the method of depositing the top electrode film 4A. An adhesion layer mainly containing, for example, Ti, Ta, $TiO_2$, Ni, $RuO_2$, $IrO_2$, or the like may also be provided between the KNN-film 3A and the top electrode film 4A in order to enhance an adhesiveness between them. A thickness of the top electrode film 4A can be, for example, 10 nm or more and 5000 nm or less. When the adhesion layer is provided, a thickness of the adhesion layer can be, for example, 1 nm or more and 200 nm or less.

The input-side piezoelectric film 3B is a film containing nitrogen (N) and not containing oxygen (O), i.e., a nitride film. The term "film not containing O" as used herein includes not only a film containing no O at all, but also a film containing a small amount of O as unavoidable impurities. The input-side piezoelectric film 3B is preferably a film having a low dielectric constant. Thereby, a reception sensitivity of ultrasonic waves can be increased. Specifically, even when a vibration of the later-described input-side vibration part is small, the input-side piezoelectric film 3B can be deformed, and a voltage can be generated due to the deformation. The dielectric constant of the input-side piezoelectric film 3B can be, for example, 25 or less, and preferably 15 or less. A lower limit of the dielectric constant of the input-side piezoelectric film 3B is not particularly limited, but the lower limit thereof is about 8 in a current technology. Also, the input-side piezoelectric film 3B preferably has a lower dielectric constant than that of the output-side piezoelectric film 3A.

The input-side piezoelectric film 3B can be deposited using, for example, a nitride which contains aluminum (Al). That is, the input-side piezoelectric film 3B can be deposited using, for example, aluminum nitride (AlN). The input-side piezoelectric film 3B is a polycrystalline film of AlN (hereinafter also referred to as an AlN-film 3B). The AlN-film 3B can be deposited using a method such as a sputtering method, a PLD (Pulsed Laser Deposition) method, an MOCVD (Metal Organic Chemical Vapor Deposition) method, a HYPE (Hydride Vapor Phase Epitaxy) method, or the like. A thickness of the AlN-film 3B can be, for example, 0.3 μm or more and 5 μm or less. The thickness of the AlN-film 3B is preferably as thick as possible within the above range. Thereby, the reception sensitivity of ultrasonic waves can be increased.

Preferably, crystals constituting the AlN-film 3B are preferentially oriented in (001) direction with respect to the surface of the substrate 1. That is, a surface of the AlN-film 3B (a surface to be a base of the input-side top electrode film 4B) is preferably mainly constituted of AlN-(001). By depositing the AlN-film 3B directly on the bottom electrode film 2B preferentially oriented in (111) direction with respect to the surface of the substrate 1, the crystals constituting the AlN-film 3B can be easily preferentially oriented in (001) direction with respect to the surface of the substrate 1. For example, 80% or more crystals in a crystal group constituting the AlN-film 3B can be oriented in (001) direction with respect to the surface of the substrate 1, and 80% or more regions of the surface of the AlN-film 3B can be easily AlN-(001).

It is preferable that half or more crystals in the crystal group constituting the AlN-film 3B have a columnar structure. Also, boundaries between the crystals constituting the AlN-film 3B, i.e., crystal grain boundaries present in the AlN-film 3B preferably penetrate the AlN-film 3B in a thickness direction of the AlN-film 3B. For example, the AlN-film 3B has more crystal grain boundaries that penetrate the AlN-film 3B in the thickness direction thereof than crystal grain boundaries (e.g., crystal grain boundaries parallel to the planar direction of the substrate 1) that do not penetrate the AlN-film 3B in the thickness direction thereof.

The AlN-film 3B may be an AlN-film containing scandium (Sc) (i.e., a Sc—AlN-film), may be an AlN-film containing magnesium (Mg) and zirconium (Zr) (i.e., a MgZr—AlN-film), or may be an AlN-film containing Mg and hafnium (Hf) (i.e., a MgHf—AlN-film). Thereby, a piezoelectric constant of the AlN-film 3B can be increased. As a result, the reception sensitivity of ultrasonic waves can be reliably increased.

The input-side top electrode film 4B (hereinafter also referred to as a top electrode film 4B) can have configurations similar to those of the above top electrode film 4A. That is, the top electrode film 4B can be deposited using, for example, various metals such as Pt, Au, Al, or Cu; or alloy containing these metals. The top electrode film 4B can also be deposited using various metals such as molybdenum (Mo) or Ru; or alloy containing these metals. For example, the top electrode film 4B can be deposited using a method such as a sputtering method, a vapor deposition method, a plating method, or a metal paste method. The top electrode film 4B does not greatly affect a crystal structure of the AlN-film 3B, unlike the bottom electrode film 2. Therefore, there are no particular limitations on a material and a crystal structure of the top electrode film 4B, and the method of depositing the top electrode film 4B. An adhesion layer mainly containing, for example, Ti, Ta, $TiO_2$, Ni, or the like may also be provided between the AlN-film 3B and the top electrode film 4B in order to enhance an adhesiveness between them. A thickness of the top electrode film 4B can be, for example, 10 nm or more and 5000 nm or less. When the adhesion layer is provided, a thickness of the adhesion layer can be, for example, 1 nm or more and 200 nm or less.

An ultrasonic output part (hereinafter also referred to as an "output part") includes a stacked part of the bottom electrode film 2, the KNN-film 3A, and the top electrode film 4A. The output part may include the adhesion layer 6, the later-described output-side vibration part formed on the substrate 1, and the like. The output part is a part that generates and transmits (outputs) ultrasonic waves. The output part is configured such that the KNN-film 3A deforms under an electric field (voltage) application from a later-described voltage applicator 11*a* connected between the bottom electrode film 2 and the top electrode film 4A, and the output-side vibration part vibrates due do this deformation of the KNN-film 3A, and ultrasonic waves generated due to this vibration of the output-side vibration part are output.

An ultrasonic input part (hereinafter also referred to as an "input part") includes a stacked part of the bottom electrode film 2, the AlN-film 3B, and the top electrode film 4B. The input part may include the adhesion layer 6, the later-described input-side vibration part formed on the substrate 1, and the like. The input part is a part that receives (inputs) ultrasonic waves which are output from the output part and are reflected by the test object. The input part is configured such that when receiving ultrasonic waves, the input-side vibration part vibrates, and thus the AlN-film 3B deforms. A voltage is generated between the bottom electrode film 2 and the top electrode film 4B due to this deformation of the AlN-film 3B.

The output part and the input part are placed in such a manner as not overlapping each other when viewed from a top surface of the substrate 1 (piezoelectric stack 10). Thereby, it is possible to prevent the output portion and the input portion from interfering with each other. As a result, a sensing accuracy of a later-described ultrasonic sensor 30 produced using the piezoelectric stack 10, can be improved. The term "when viewed from the top surface of the substrate 1" used herein indicates "when viewed a main surface of the substrate 1 on which the KNN-film 3A, the AlN-film 3B, and the like are provided, from above in a vertical direction". The term "vertical direction" used herein is a direction which coincides with at least either a propagation direction of ultrasonic waves transmitted from the output part or a propagation direction of ultrasonic waves received by the input part.

A distance d between the output part and the input part is preferably the shortest possible distance at which interference (contact) does not occur between them. That is, although the output part and the input part are not in contact with each other, the distance d between the output part and the input part is preferably as short as possible. For example, the distance (maximum distance) d between the output part and the input part is preferably 500 μm or less. More preferably, the distance between the output part and the input part is brought as close as possible with a MEMS manufacturing technology. Thereby, the later-described ultrasonic sensor 30 can be reduced in size by increasing a degree of an integration of the output part and the input part while also having a high performance.

(2) CONFIGURATION OF PIEZOELECTRIC ELEMENT AND ULTRASONIC SENSOR

Figure 3:
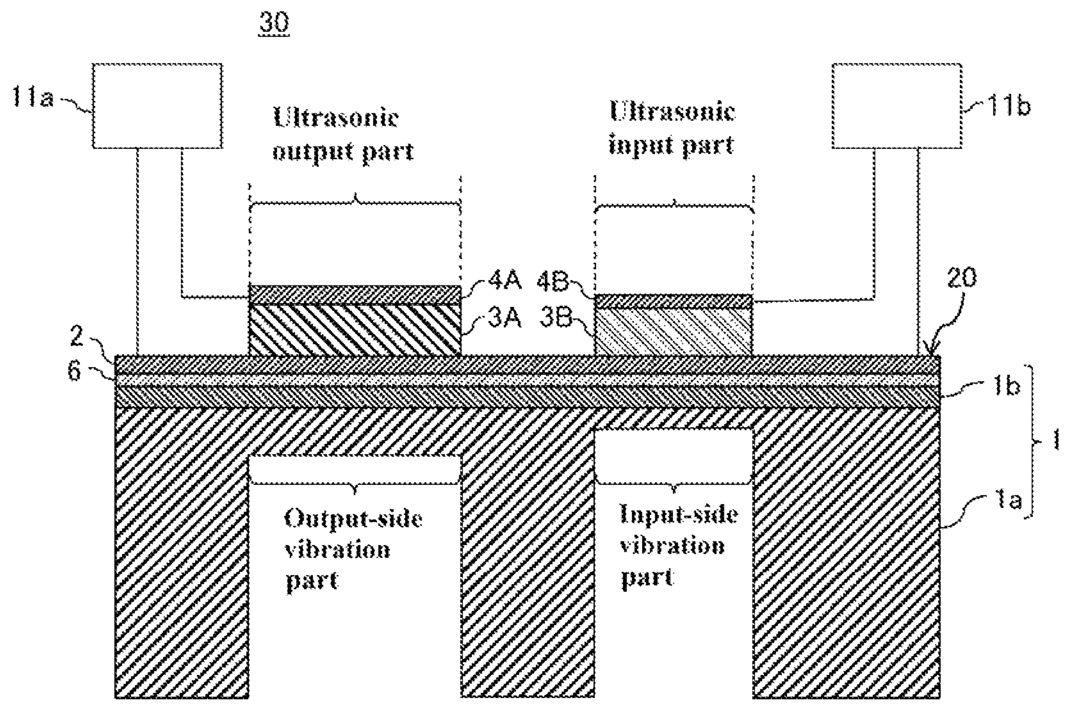
FIG. 3 is a view illustrating an example of a schematic configuration of an ultrasonic sensor according to the embodiment of the present disclosure.

FIG. 3 illustrates a schematic configuration view of an ultrasonic sensor 30 according to the present embodiment. The ultrasonic sensor 30 includes at least one piezoelectric element 20, as well as a voltage applicator 11*a* and a voltage detector 11*b* connected to the piezoelectric element 20. Examples of applications of the ultrasonic sensor 30 include a p-MUT.

The piezoelectric element 20 indicates an element including the output-side piezoelectric film 3A and the input-side piezoelectric film 3B, and is obtained by shaping the above piezoelectric stack 10 into a predetermined form. When shaping the piezoelectric stack 10 into a predetermined form, an output-side vibration part is formed on the substrate 1 at a position corresponding to the output part, and an input-side vibration part is formed on the substrate 1 at a position corresponding to the input part, for example. The output-side vibration part and the input-side vibration part can be formed by forming, for example, a membrane structure or a cantilever structure into the substrate 1 included in the piezoelectric stack 10. FIG. 3 illustrates an example of the piezoelectric element 20 in which a membrane structure is formed into the substrate 1.

Resonance frequencies of the output-side vibration part and the input-side vibration part may be the same, or may be different. For example, the output-side vibration part and the input-side vibration part may be given different widths according to the resonance frequency, such as making the width of the output-side vibration part larger than the width of the input-side vibration part. As another example, a portion of the substrate 1 constituting the output-side vibration part and a portion of the substrate 1 constituting the input-side vibration part may be given different thicknesses according to the resonance frequency, such as making the thickness of the substrate 1 at a position corresponding to the output part larger than the thickness of the substrate 1 at a position corresponding to the input part.

The voltage applicator 11*a* is a means that applies a voltage between the bottom electrode film 2 (output-side bottom electrode film 2A) and the top electrode film 4A, and the voltage detector 11*b* is a means thar detects a voltage generated between the bottom electrode film 2 (input-side bottom electrode film 2B) and the top electrode film 4B. Various known means can be used as the voltage applicator 11*a* and the voltage detector 11*b*.

The above output part can function as an vibrator for generating ultrasonic waves by connecting the voltage applicator 11*a* between the bottom electrode film 2 and the top electrode film 4A of the piezoelectric element 20. The KNN-film 3A can deform under a voltage application from the voltage applicator 11*a* between the bottom electrode film 2 and the top electrode film 4A. Due to this deformation motion, the output-side vibration part can vibrate, and ultrasonic waves can be generated by this vibration.

The input part can function as a sensor by connecting the voltage detector 11*b* between the bottom electrode film 2 and the top electrode film 4B of the piezoelectric element 20. The input part receives ultrasonic waves, the input-side vibration part vibrates, which in turn deforming the AlN-film 3B. Due to the deformation of the AlN-film 3B, a voltage is generated between the bottom electrode film 2 and the top electrode film 4B. A magnitude of ultrasonic waves received by the input part can be measured by detecting the voltage using the voltage detector 11*b*.

The ultrasonic sensor 30 is configured such that ultrasonic waves are transmitted from the output part toward a test object, and the input part receives ultrasonic waves reflected by the test object. Accordingly, for example, the presence or absence of the test object can be determined by detecting a magnitude of the voltage detected using the voltage detector 11*b* a plurality of times, and observing changes in the voltage. Also, for example, a distance to the test object can be known by measuring the time from a start of a voltage application using the voltage applicator 11*a* to a voltage detection using the voltage detector 11*b* a plurality of times, and observing changes in that time.

(3) METHOD OF MANUFACTURING PIEZOELECTRIC STACK, PIEZOELECTRIC ELEMENT, AND ULTRASONIC SENSOR

A method of manufacturing the piezoelectric stack 10, the piezoelectric element 20, and the ultrasonic sensor 30 will be described hereinafter, with reference to FIGS. 4(*a*) to 4(*f*).

(Deposition of Bottom Electrode Film)

The substrate 1 is firstly prepared, and the adhesion layer 6 (Ti-layer) and the bottom electrode film 2 (Pt-film) are deposited in this order on any one of main surfaces of the substrate 1 using, for example, the sputtering method. As a result, a stack 10*a* as illustrated in FIG. 4(*a*) is obtained. It is also acceptable to prepare the substrate 1 (i.e., the stack 10*a*) with the adhesion layer 6 or the bottom electrode film 2 deposited on any one of the main surfaces of the substrate 1 in advance.

The following conditions are exemplified as the conditions for forming the adhesion layer 6.

Temperature (substrate temperature): 100° C. or more and 500° C. or less, and preferably 200° C. or more and 400° C. or less RF-power: 1000 W or more and 1500 W or less, and preferably 1100 W or more and 1300 W or less Atmosphere: Argon (Ar) gas atmosphere Atmospheric pressure: 0.1 Pa or more and 0.5 Pa and less, and preferably 0.2 Pa or more and 0.4 Pa or less Time: 30 seconds or more and 3 minutes or less, and preferably 30 seconds or more and 2 minutes or less The following conditions are exemplified as the conditions for depositing the bottom electrode film 2. A metal target containing, for example, Pt can be used as a target used in the sputtering deposition.

Deposition temperature (substrate temperature): 100° C. or more and 500° C. or less, and preferably 200° C. or more and 400° C. or less RF-power: 1000 W or more and 1500 W or less, and preferably 1100 W or more and 1300 W or less Deposition atmosphere: Ar-gas atmosphere Atmospheric pressure: 0.1 Pa or more and 0.5 Pa and less, and preferably 0.2 Pa or more and 0.4 Pa or less Deposition time: 3 minutes or more and 10 minutes or less, and preferably 4 minutes or more and 7 minutes or less (Deposition of Output-Side Piezoelectric Film)

After the deposition of the bottom electrode film 2 is complete, the KNN-film 3A is deposited on the stack 10*a* (on the bottom electrode film 2) using, for example, the sputtering method. A composition ratio of the KNN-film 3A can be adjusted by controlling a composition of a target material used in the sputtering deposition, for example. The target material can be produced by mixing and calcining $K_2CO_3$-powder, $Na_2CO_3$-powder, $Nb_2O_5$-powder, Cu-powder (or CuO-powder or $Cu_2O$-powder), MnO-powder, and the like. The composition of the target material can be controlled by adjusting a mixing ratio of $K_2CO_3$-powder, $Na_2CO_3$-powder, $Nb_2O_5$-powder, Cu-powder (or CuO-powder or $Cu_2O$-powder), MnO-powder, and the like.

The following conditions are exemplified as the conditions for depositing the KNN-film 3A. A deposition time is appropriately set according to the thickness of the KNN-film 3A to be deposited.

Figures 4A, 4B, 4C, 4D, 4E, 4F:
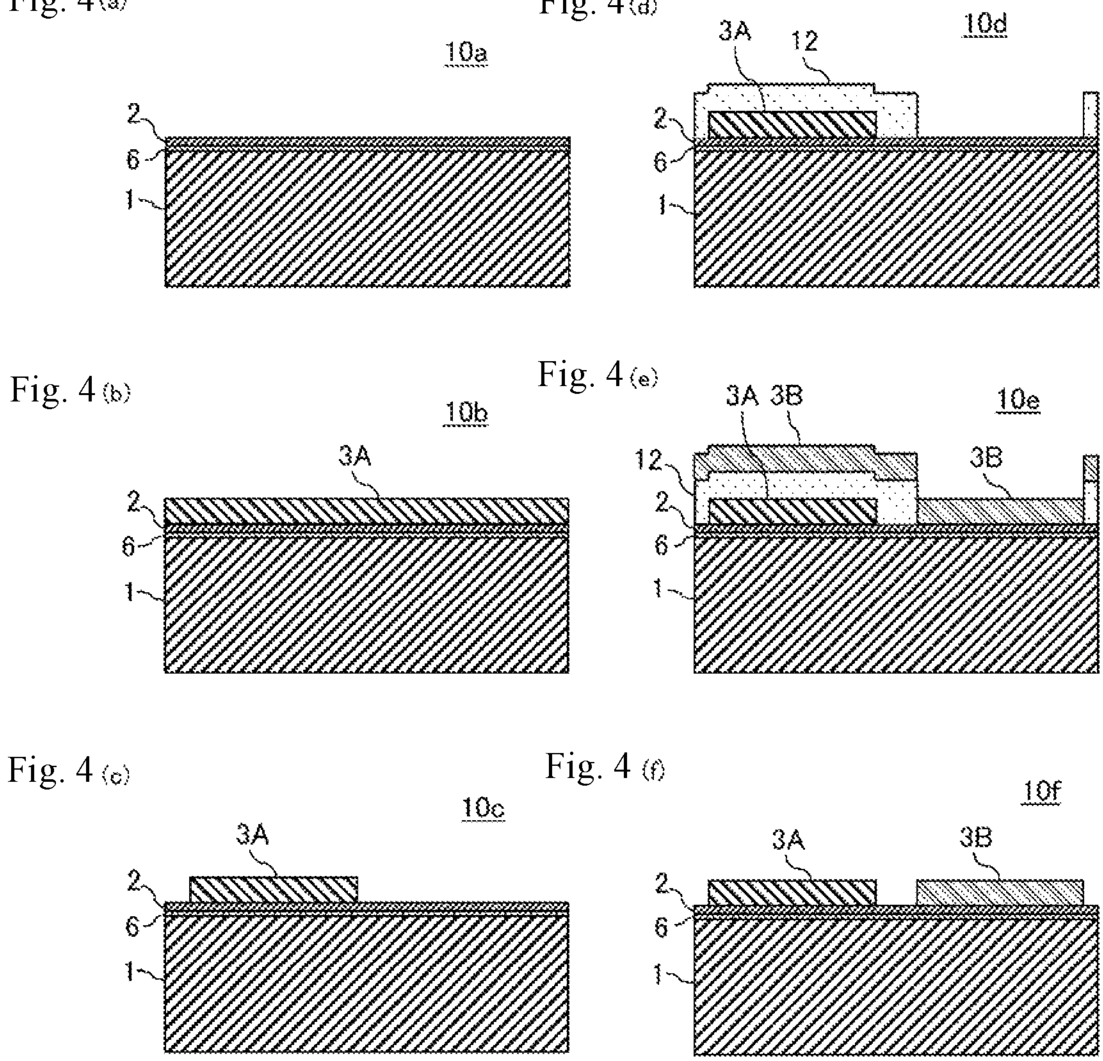
FIG. 4(*a*) is a view illustrating an example of a cross-sectional structure of a stack 10*a* before depositing an output-side piezoelectric film, FIG. 4(*b*) is a view illustrating an example of a cross-sectional structure of a stack 10*b* after depositing the output-side piezoelectric film, FIG. 4(*c*) is a view illustrating an example of a cross-sectional structure of a stack 10*c* after shaping the output-side piezoelectric film into a predetermined form, FIG. 4(*d*) is a view illustrating an example of a cross-sectional structure of a stack 10*d* after depositing a protective film, FIG. 4(*e*) is a view illustrating an example of a cross-sectional structure of a stack 10*e* after depositing an input-side piezoelectric film, and FIG. 4(*f*) is a view illustrating an example of a cross-sectional structure of a stack 10*f* after removing the protective film.

- Deposition temperature (substrate temperature): more than 350° C. and 700° C. or less, and preferably 550° C. or more and 650° C. or less
- RF-power: 2000 W or more and 2400 W or less, and preferably 2100 W or more and 2300 W or less
- Deposition atmosphere: mixed gas of Ar gas+oxygen ($O_2$) gas
- Atmosphere (oxygen (O)-containing atmosphere) pressure: 0.2 Pa or more and 0.5 Pa or less, and preferably 0.2 Pa or more and 0.4 Pa or less
- Partial pressure of Ar-gas relative to $O_2$-gas (partial pressure ratio of Ar/$O_2$): 30/1 to 20/1, and preferably 27/1 to 23/1
- Deposition rate: 0.5 μm/hr or more and 2 μm/hr or less, and preferably 0.5 μm/hr or more and 1.5 μm/hr or less As a result, a stack 10*b* as illustrated in FIG. 4(*b*) is obtained. Also, the KNN-film 3A having a high quality, for example, the KNN-film 3A having the piezoelectric constant of 100 pm/V or more can be deposited by depositing the KNN-film 3A under the above conditions.

After the deposition of the KNN-film 3A is complete, the KNN-film 3A is shaped into a predetermined form (predetermined pattern) by etching or the like. As a result, a stack 10*c* as illustrated in FIG. 4(*c*) is obtained.

(Deposition of Protective Film)

Subsequently, a protective film 12 that protects the KNN-film 3A is deposited. The protective film 12 is provided in such a manner as protecting (covering) the KNN-film 3A.

The protective film 12 can be deposited using a material which is not reduced (i.e., which does not deteriorate) in a deposition atmosphere (N-containing atmosphere) of the AlN-film 3B, which can protect the KNN-film 3A, and which can be easily removed by wet etching or the like using, for example, an etchant containing fluorine (F). The protective film 12 can be deposited using, for example, silicon oxide ($SiO_2$). The protective film 12 can be deposited using a CVD (Chemical Vapor Deposition) method, a sputtering method, a vapor deposition method, or the like. A thickness of the protective film 12 can be a thickness which can continuously cover a surface of the KNN-film 3A, i.e., a thickness which allows the protective film 12 to be a continuous film. Hereinafter, the "deposition atmosphere of the AlN-film 3B" is also referred to as an "N-containing atmosphere".

The following conditions are exemplified as cthe onditions for depositing the protective film 12 using a plasma CVD method.

- Deposition temperature (substrate temperature): 200° C. or more and 400° C. or less, preferably 300° C. or more and 400° C. or less, and more preferably 350° C.
- RF-power: 70 W or more and 150 W or less, preferably 70 W or more and 120 W or less, and more preferably 100 W
- Raw material: Tetraethoxysilane (abbreviation: TEOS)
- Deposition atmosphere: $O_2$-gas atmosphere
- Atmospheric pressure: 50 Pa or more and 100 Pa or less, preferably 60 Pa or more and 70 Pa or less, and more preferably 67 Pa A deposition time is appropriately set according to the thickness of the protective film 12 to be deposited. A deposition time can be, for example, 5 minutes or more and 15 minutes or less. Specifically, the deposition time can be 11 minutes when depositing the protective film 12 having the thickness of 400 nm.

By depositing the protective film 12 under the above conditions, the protective film 12 being a continuous film and covering the KNN-film 3A, can be deposited. The protective film 12 acts as a film suppressing a reduction of the KNN-film 3A in the N-containing atmosphere, and protects the KNN-film 3A. This protective action can prevent the KNN-film 3A from being exposed to the N-containing atmosphere during the deposition of the AlN-film 3B. Thereby, it is possible to prevent the KNN-film 3A from being reduced and deteriorating by N-element during the deposition of the AlN-film 3B, i.e., to prevent the KNN-film 3A from deteriorating due to a removal of oxygen from the KNN-film 3A by the N-element. As a result, changes in the piezoelectric performance and the quality of the KNN-film 3A (e.g., a reduction in the insulating property) can be suppressed.

After the deposition of the protective film 12 is complete, the protective film 12 is shaped into a predetermined pattern. For example, the protective film 12 is removed by etching or the like from a position on the substrate 1 where the AlN-film 3B will be to be deposited. As a result, a stack 10*d* as illustrated in FIG. 4(*d*) is obtained.

(Deposition of Input-Side Piezoelectric Film)

Subsequently, the AlN-film 3B is deposited using, for example, the sputtering method. A metal target containing, for example, Al can be used as a target material.

The following conditions are exemplified as cthe onditions for depositing the AlN-film 3B. A deposition time is appropriately set according to the thickness of the AlN-film 3B to be deposited.

- Deposition temperature (substrate temperature): 300° C. or more and 350° C. or less
- RF-power: 600 W or more and 900 W or less, and preferably 700 W or more and 800 W or less
- Deposition atmosphere: mixed gas atmosphere of Ar-gas+nitrogen ($N_2$) gas (N-containing atmosphere)
- Atmospheric pressure: 0.5 Pa or more and 2.0 Pa or less, and preferably 0.7 Pa or more and 1.0 Pa or less
- Partial pressure of Ar-gas to $N_2$-gas (partial pressure ratio of Ar/$N_2$): 1/10 to 1/2, preferably 1/7 to 1/3, and more preferably 1/6 to 1/4
- Deposition rate: 0.3 μm/hr or more and 2 μm/hr or less, preferably 0.3 μm/hr or more and 1 μm/hr or less, and more preferably 0.3 μm/hr or more and 0.5 μm/hr or less
- The deposition atmosphere may be a mixed gas atmosphere of Ar-gas and ammonia ($NH_3$) gas.

As a result, a stack 10*e* as illustrated in FIG. 4(*e*) is obtained. Also, by depositing the AlN-film 3B under the above conditions, the AlN-film 3B having a high quality, for example, the AlN-film 3B having the dielectric constant of 25 or less can be deposited. Since the KNN-film 3A is covered with the protective film 12 as described above, almost none of the KNN-film 3A is reduced by the N-element present in the N-containing atmosphere.

After the deposition of the AlN-film 3B is complete, the protective film 12 is removed by wet etching using, for example, an etchant containing fluorine (F). As a result, the KNN-film 3A is exposed. Also, using the protective film 12 as a lift-off layer, an unnecessary AlN-film 3B formed on the protective film 12 is removed. That is, the AlN-film 3B is left only in a region where the AlN-film 3B is to be deposited. As a result, a stack 10*f* as illustrated in FIG. 4(*f*) is obtained. The etchant containing F can be, for example, a buffered hydrofluoric acid (BHF) solution containing hydrogen fluoride (HF) at a concentration of 4.32 mol/L and ammonium fluoride ($NH_4F$) at a concentration of 10.67 mol/L.

(Deposition of Top Clectrode Film)

Then, Pt-films as the top electrode films 4A and 4B are deposited on the KNN-film 3A and the AlN-film 3B using, for example, the sputtering method. Conditions for depositing the top electrode films 4A and 4B can be similar to the above conditions for depositing the bottom electrode film 2. As a result, the piezoelectric stack 10 as illustrated in FIG. 1 is obtained.

Then, the piezoelectric element 20 as illustrated in FIG. 3 is obtained by shaping the piezoelectric stack 10 into a predetermined form by etching or the like, and the ultrasonic sensor 30 is obtained by connecting at least either the voltage applicator 11*a* or the voltage detector 11*b* to the piezoelectric element 20.

(4) EFFECTS OBTAINED BY PRESENT EMBODIMENT

According to the present embodiment, the following one or more effects are obtained.

(a) The piezoelectric stack 10 includes the output-side piezoelectric film 3A (KNN-film 3A) and the input-side piezoelectric film 3B (AlN-film 3B), and the output part and the input part do not overlap each other when viewed from the top surface of the substrate 1, the output part being configured by the stacked part including the KNN-film 3A, and the input part being configured by the stacked part including the AlN-film 3B. Thereby, the KNN-film 3A and the AlN-film 3B can be driven independently. Also, in the piezoelectric stack 10, the output-side piezoelectric film 3A is the oxide film having a relatively high piezoelectric constant (i.e., the KNN-film 3A), and the input-side piezoelectric film 3B is the nitride film having a relatively low dielectric constant (i.e., the AlN-film 3B). By using such a piezoelectric stack 10, the ultrasonic sensor 30 having a deep penetration depth of ultrasonic waves in a test object, and having a high resolution (high reception sensitivity), can be obtained. That is, the ultrasonic sensor 30 having the high performance can be obtained.

(b) According to the present embodiment, the piezoelectric stack 10 including the output part and the input part, the piezoelectric element 20 obtained by processing the piezoelectric stack 10, and the ultrasonic sensor 30 produced using the piezoelectric element 20 can be collectively formed in the MEMS manufacturing process. That is, the ultrasonic sensor 30 having the high performance can be produced without causing a complicated manufacturing process.

(c) Since the output part and the input part are not in contact with each other, it is possible to prevent the output part and the input part from interfering with each other. For example, it is possible to prevent the vibration of the output-side vibration part from transmitting to the input-side vibration part. Thereby, the sensing accuracy of the ultrasonic sensor 30 can be improved. That is, the ultrasonic sensor 30 can have a higher performance.

(d) In the piezoelectric stack 10, the distance between the output part and the input part is, for example, 500 μm or less, and preferably 300 μm or less. Preferably, the distance between the output part and the input part is brought as close as possible with the MEMS manufacturing technology. Thereby, the degree of the integration of the output part and the input part can be increased while also improving the sensing accuracy of the ultrasonic sensor 30. That is, the ultrasonic sensor 30 having the high performance and a small size can be obtained.

(e) Since the protective film 12 that protects the KNN-film 3A, is provided after depositing the KNN-film 3A and before depositing the AlN-film 3B, it is possible to prevent the KNN-film 3A from being exposed to the N-containing atmosphere during the deposition of the AlN-film 3B. Thereby, it is possible to prevent the KNN-film from being reduced the deteriorating by the N element in the N-containing atmosphere. As a result, the deterioration of the piezoelectric performance and the quality of the KNN-film 3A can be suppressed. That is, the piezoelectric stack 10 including the KNN-film 3A having the high quality and the high performance, and the AlN-film 3B having the high quality and the high performance, can be obtained. For example, the piezoelectric stack 10 including the KNN-film 3A having the high piezoelectric constant and the AlN-film 3B having the low dielectric constant, can be obtained.

(f) Since the KNN-film 3A contains at least one metal element selected from the group consisting of Cu, Mn, Fe, and V, the etching resistance of the KNN-film 3A to the fluorine-based etchant such as a BHF solution, can be improved. Thereby, it is possible to prevent the KNN-film 3A from being etched when removing the protective film 12 by wet etching using the BHF solution or the like. As a result, the deterioration in the piezoelectric performance and the quality of the KNN-film 3A can be reliably suppressed. The inventors have confirmed that the effect of improving the etching resistance of the KNN-film 3A can be particularly improved when, among the above metal elements, Cu is added in the KNN-film 3A.

Here, for reference, a conventional ultrasonic sensor will be described. In the conventional ultrasonic sensor, a transmission and a reception of ultrasonic waves are performed using a piezoelectric element including a piezoelectric film being an oxide film such as a PZT-film. However, in such a ultrasonic sensor, there is a problem as follows: although the penetration depth of ultrasonic waves is large, the dielectric constant of the piezoelectric film is high, and the resolution of the sensor is low (i.e., the reception sensitivity is low). On the other hand, it is also conceivable that in the conventional ultrasonic sensor, in order to increase the resolution of the ultrasonic sensor, the transmission and reception of ultrasonic waves are performed using a piezoelectric element including a piezoelectric film being a nitride film such as an AlN-film. However, in such a ultrasonic sensor, there is a problem as follows: although the resolution is high, the piezoelectric constant of the piezoelectric film is low, and the penetration depth of ultrasonic waves is shallow. In response to such a problem, in the present embodiment, the ultrasonic sensor 30 includes the output-side piezoelectric film 3A (KNN-film 3A) being the oxide film and the input-side piezoelectric film 3B (AlN-film 3B) being the nitride film, the transmission of ultrasonic waves is performed using the output part including the KNN-film 3A, and the reception of ultrasonic waves is performed using the input part including the AlN-film 3B. Thereby, according to the present embodiment, the high-performance ultrasonic sensor 30 having the deep penetration depth of ultrasonic waves and the high resolution, and the like can be obtained.

It is also conceivable that at least two separate piezoelectric elements are prepared, these at least two piezoelectric elements are provided on each of vibration parts of the substrate on which the vibration parts are formed, and thereby constituting the ultrasonic sensor. Note that the at least two piezoelectric elements are an element for the transmission of ultrasonic waves and an element for the reception of ultrasonic waves, the element for the transmission including a piezoelectric film being the oxygen film, and the element for the reception including a piezoelectric film being the nitride film. However, when producing such an ultrasonic sensor, a process of attaching (adhering) the piezoelectric elements onto the substrate, or the like, is required. Therefore, a manufacturing process of the ultrasonic sensor is complicated in some cases. Also, in a process of attaching the piezoelectric elements onto the substrate, the distance between the adjacent piezoelectric elements can only be about 1 mm, or about 500 μm at a minimum. Therefore, there is a problem that it is difficult to increase the degree of the integration of the piezoelectric elements. On the other hand, according to the present embodiment, the piezoelectric stack 10 (the piezoelectric element 20, the ultrasonic sensor 30) which includes the output part including the KNN-film 3A and the input part including the AlN-film 3B can be collectively produced in the MEMS manufacturing process. That is, according to the present embodiment, the high-performance ultrasonic sensor 30 having the deep penetration depth of ultrasonic waves and the high resolution can be produced without causing the complicated manufacturing process. Also, in the present embodiment, since the piezoelectric stack 10 and the like are produced collectively in the MEMS manufacturing process, the distance between the output part and the input part can be brought as close as possible with the MEMS manufacturing technology. As described above, according to the present embodiment, the ultrasonic sensor 30 having the high performance and the small size can be produced collectively in the MEMS manufacturing process.

(5) MODIFIED EXAMPLES

The present embodiment can be modified as the following modified examples. In the following description of modified examples, the same reference numerals are given to components that are the same as those in the above embodiment, and descriptions thereof are omitted.

Modified Example 1

Figure 5:
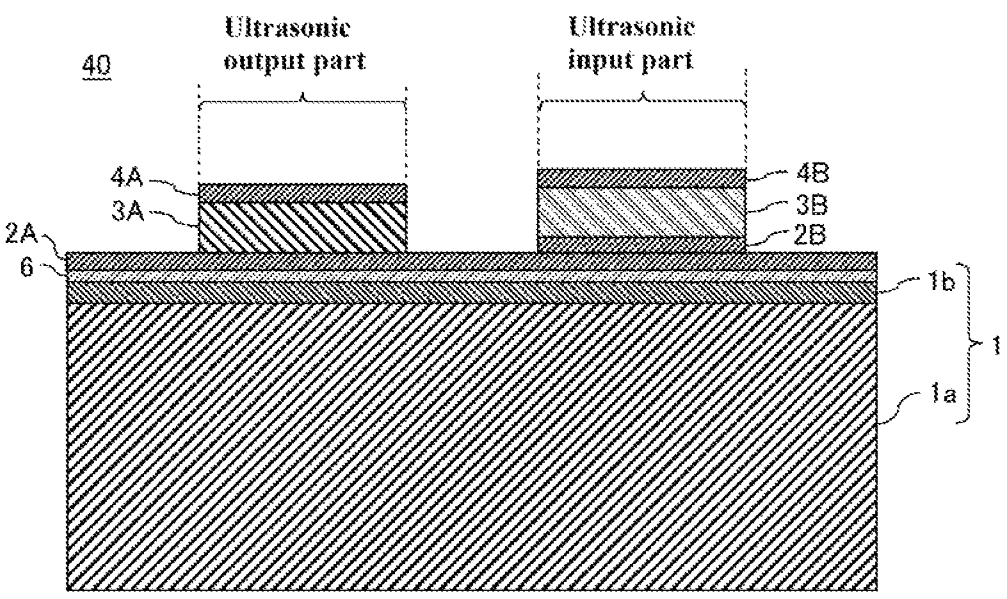
FIG. 5 is a view illustrating a cross-sectional structure of a piezoelectric stack according to a modified example of an embodiment of the present disclosure.

As illustrated in FIG. 5, a piezoelectric stack 40 may include an output-side bottom electrode film 2A (hereinafter also referred to as a bottom electrode film 2A) and an input-side bottom electrode film 2B (hereinafter also referred to as a bottom electrode film 2B) provided on the bottom electrode film 2A.

The bottom electrode film 2A can have configurations similar to those of the bottom electrode film 2 in the above embodiment.

The bottom electrode film 2B can be deposited using, for example, at least either hafnium (Hf) or molybdenum (Mo). The bottom electrode film 2B is a single-crystal film or a polycrystalline film. Preferably, crystals constituting the bottom electrode film 2B are preferentially oriented in (111) direction with respect to the surface of the substrate 1. That is, a surface of the bottom electrode film 2B (a surface to be a base of the input-side piezoelectric film 3B) is preferably mainly constituted of Hf-(111) or Mo-(111). The bottom electrode film 2B can be deposited using a method such as a sputtering method or a vapor deposition method. The bottom electrode film 2B can also have configurations similar to those of the above bottom electrode film 2. The bottom electrode film 2B can also be deposited using, for example, Pt. The bottom electrode film 2B can also be deposited using, for example, Al, Cu, or silver (Ag). A thickness of the bottom electrode film 2B can be for example, 100 nm or more and 400 nm or less. Although not illustrated in FIG. 5, an adhesion layer similar to the above adhesion layer 6 may be provided between the bottom electrode film 2A and the bottom electrode film 2B in order to enhance an adhesiveness between them.

In the present modified example, an output part includes a stacked part of the bottom electrode film 2A, the KNN-film 3A, and the top electrode film 4A. Also, an input part includes a stacked part of the bottom electrode film 2B, the AlN-film 3B, and the top electrode film 4B. The input part may include the bottom electrode film 2A located under the AlN-film 3B.

Figures 6, 6C:
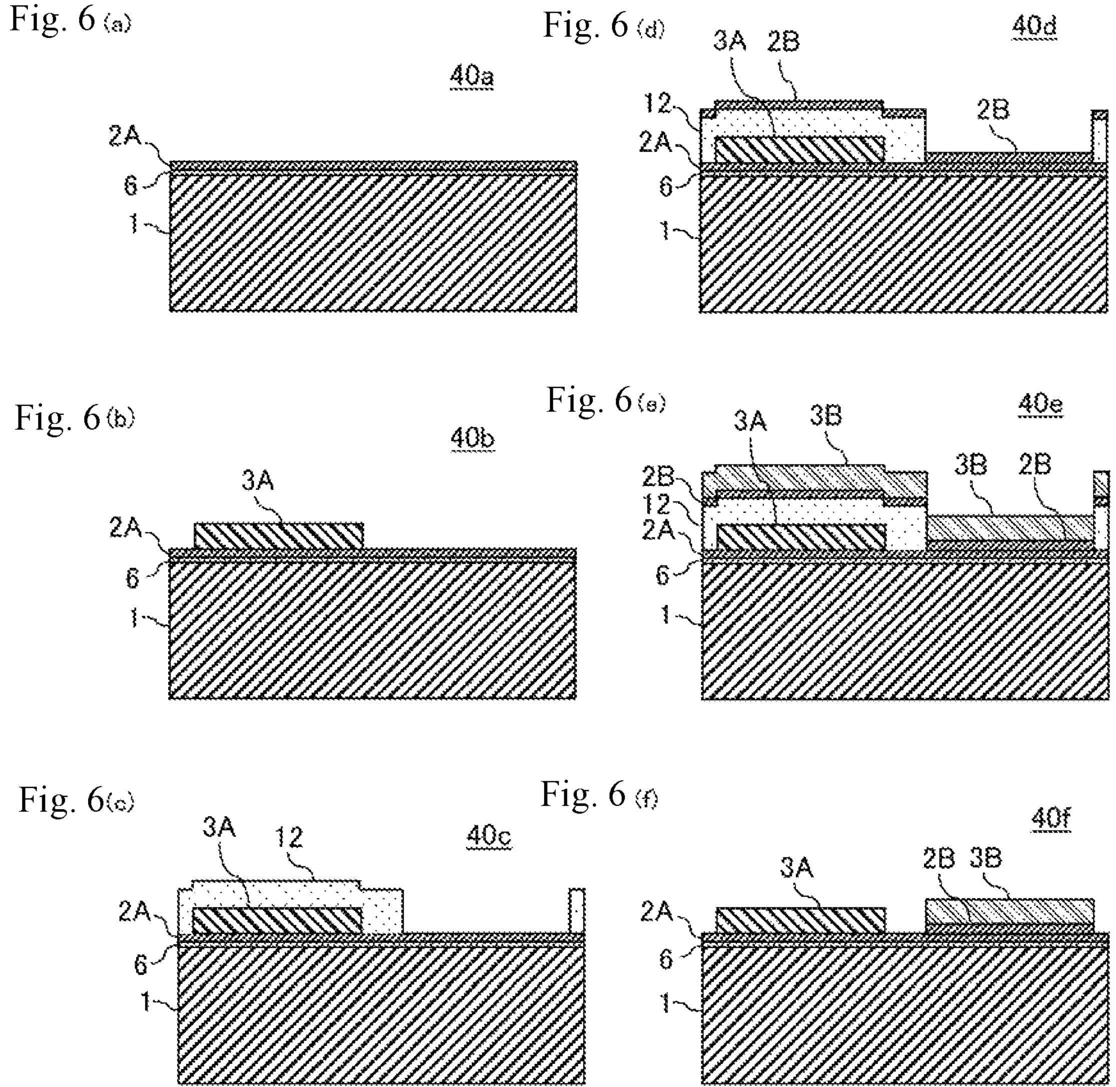
FIG. 6(*a*) is a view illustrating an example of a cross-sectional structure of a stack 40*a* before depositing an output-side piezoelectric film, FIG. 6(*b*) is a view illustrating an example of a cross-sectional structure of a stack 40*b* after depositing the output-side piezoelectric film and shaping the output-side piezoelectric film into a predetermined form, FIG. 6(*c*) is a view illustrating an example of a cross-sectional structure of a stack 40*c* after depositing a protective film, FIG. 6(*d*) is a view illustrating an example of a cross-sectional structure of a stack 40*d* after depositing an input-side bottom electrode film, FIG. 6(*e*) is a view illustrating an example of a cross-sectional structure of a stack 40*e* after depositing an input-side piezoelectric film, and FIG. 6(*f*) is a view illustrating an example of a cross-sectional structure of a stack 40*f* after removing the protective film.

A method of manufacturing the piezoelectric stack 40 illustrated in FIG. 5 will be described later, with reference to FIGS. 6(*a*) to 6(*f*).

The substrate 1 is firstly prepared, and the adhesion layer 6 (Ti-layer) and the bottom electrode film 2A are deposited in this order on any one of the main surfaces of the substrate 1 using, for example, the sputtering method. Conditions for forming the adhesion layer 6 and the bottom electrode film 2A can be conditions similar to the above conditions for forming the adhesion layer 6 and the bottom electrode film 2. As a result, a stack 40*a* as illustrated in FIG. 6(*a*) is obtained.

Subsequently, the KNN-film 3A is deposited using a procedure and conditions similar to those in the above embodiment, and the KNN-film 3A is shaped into a predetermined pattern. As a result, a stack 40*b* as illustrated in FIG. 6(*b*) is obtained. After that, the protective film 12 is deposited using a procedure and conditions similar to those in the above embodiment, and is shaped into a predetermined pattern. As a result, a stack 40*c* as illustrated in FIG. 6(*c*) is obtained.

Then, the bottom electrode film 2B is deposited using, for example, the sputtering method. As a result, a stack 40*d* as illustrated in FIG. 6(*d*) is obtained. In the present modified example, the bottom electrode film 2B is also deposited on the protective film 12, as illustrated in FIG. 6(*d*).

The following conditions are exemplified as the conditions for depositing the bottom electrode film 2B. A metal target containing, for example, Hf or Mo can be used as a target used in the sputtering deposition.

Deposition temperature (substrate temperature): 100° C. or more and 500° C. or less, and preferably 200° C. or more and 400° C. or less RF-power: 1000 W or more and 1500 W or less, and preferably 1100 W or more and 1300 W or less Deposition atmosphere: Ar-gas atmosphere Atmospheric pressure: 0.1 Pa or more and 0.5 Pa and less, and preferably 0.2 Pa or more and 0.4 Pa or less Deposition time: 3 minutes or more and 10 minutes or less, and preferably 4 minutes or more and 7 minutes or less Then, the AlN-film 3B is deposited using a procedure and conditions similar to those in the above embodiment. As a result, a stack 40*e* as illustrated in FIG. 6(*e*) is obtained. After that, the protective film 12 is removed using a procedure and conditions similar to those in the above embodiment. As a result, the KNN-film 3A is exposed. Also, using the protective film 12 as a lift-off layer, unnecessary bottom electrode film 2B and AlN-film 3B formed on the protective film 12 are also removed. That is, the bottom electrode film 2B and the AlN-film 3B are left only in regions where the bottom electrode film 2B and the AlN-film 3B are to be deposited. As a result, a stack 40*f* as illustrated in FIG. 6(*f*) is obtained. After that, the top electrode films 4A and 4B are deposited using a procedure and conditions similar to those in the above embodiment. As a result, the piezoelectric stack 40 as illustrated in FIG. 5 is obtained.

Other configurations and method can be similar to those in the above embodiment. The present modified example can also provide effects similar to those of the above embodiment. That is, in the present modified example as well, the ultrasonic sensor 30 having the high performance can be obtained, and such an ultrasonic sensor 30 can be collectively produced in the MEMS manufacturing process.

Modified Example 2

Figure 7:
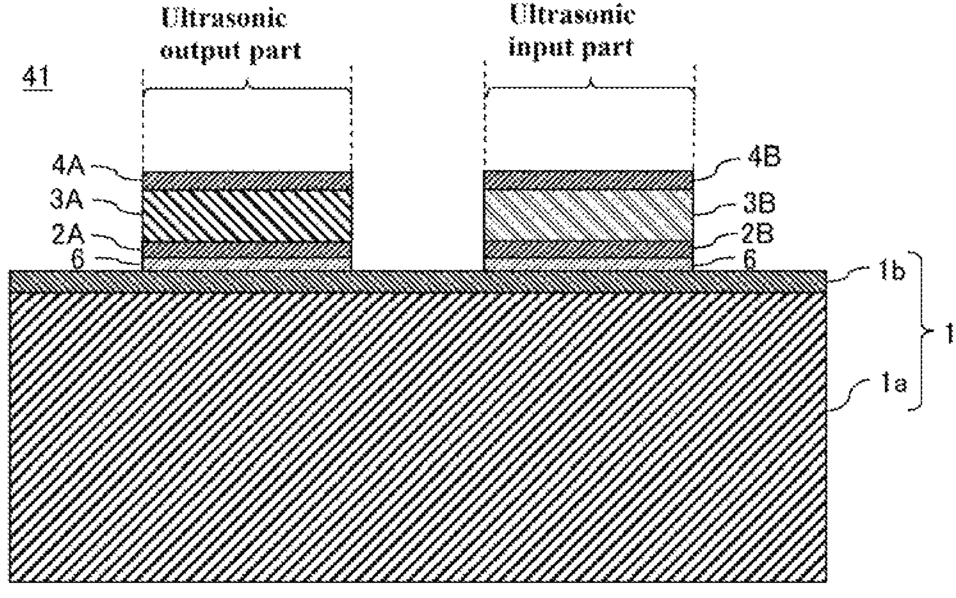
FIG. 7 is a view illustrating a cross-sectional structure of a piezoelectric stack according to a modified example of an embodiment of the present disclosure.

As illustrated in FIG. 7, a piezoelectric stack 41 may be configured by providing the bottom electrode film 2A on the substrate 1 only at a position facing the KNN-film 3A, and providing the bottom electrode film 2B on the substrate 1 only at a position facing the AlN-film 3B. The bottom electrode film 2A can have configurations similar to those of the bottom electrode film 2, and the bottom electrode film 2B can have configurations similar to those of the above modified example 1.

In the present modified example, the output part includes a stacked part of the bottom electrode film 2A, the KNN-film 3A, and the top electrode film 4A. Also, the input part includes a stacked part of the bottom electrode film 2B, the AlN-film 3B, and the top electrode film 4B.

Other configurations can be similar to those in the above embodiment and modified examples. The present modified example can also provide effects similar to those of the above embodiment and the like. That is, in the present modified example as well, the ultrasonic sensor 30 having the high performance can be obtained, and such an ultrasonic sensor 30 can be collectively produced in the MEMS manufacturing process.

Also, according to the present modified example, ultrasonic waves can be transmitted from the output part toward a test object, and the input part can receive ultrasonic waves reflected by the test object. Thereby, for example, the ultrasonic sensor 30 can continuously detect the magnitude of the voltage detected using the voltage detector 11*b*. Also, for example, the ultrasonic sensor 30 can continuously measure the time from the start of the voltage application using the voltage applicator 11*a* to the voltage detection using the voltage detector 11*b*. Thus, according to the present modified example, a degree of freedom in the transmission and reception of ultrasonic waves in the ultrasonic sensor 30 can also be increased.

Modified Example 3

Figure 8:
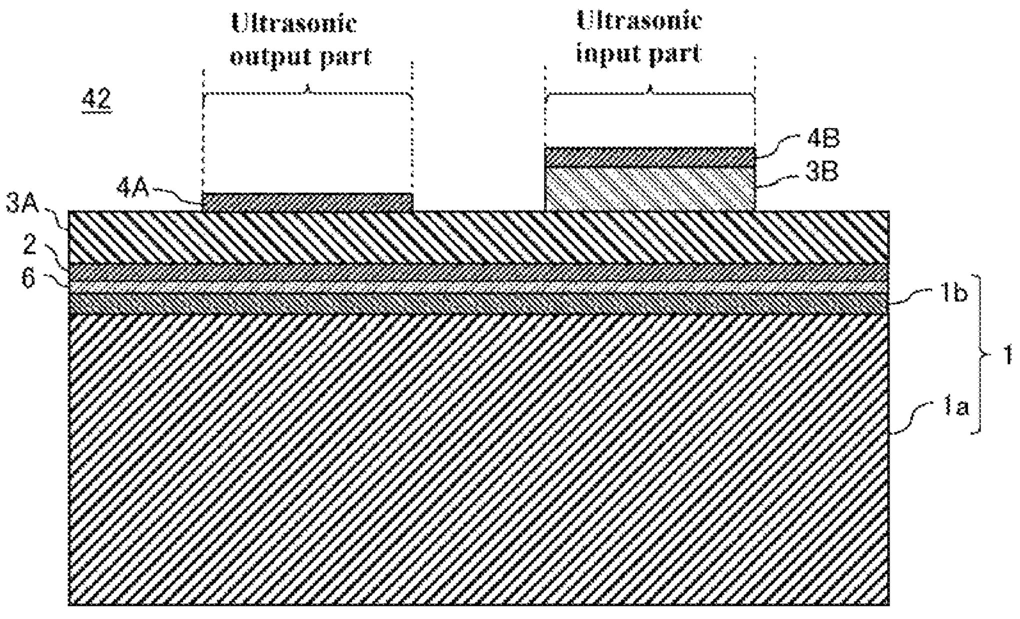
FIG. 8 is a view illustrating a cross-sectional structure of a piezoelectric stack according to a modified example of an embodiment of the present disclosure.

As illustrated in FIG. 8, a piezoelectric stack 42 may be configured by providing the AlN-film 3B on the KNN-film 3A.

In the present modified example, the output part includes a stacked part of the bottom electrode film 2, the KNN-film 3A, and the top electrode film 4A. Also, the input part includes a stacked part of the bottom electrode film 2, the AlN-film 3B, and the top electrode film 4B. The input part may include the portion of the KNN-film 3A located under the AlN-film 3B.

Figures 9A, 9B, 9C, 9D, 9E:
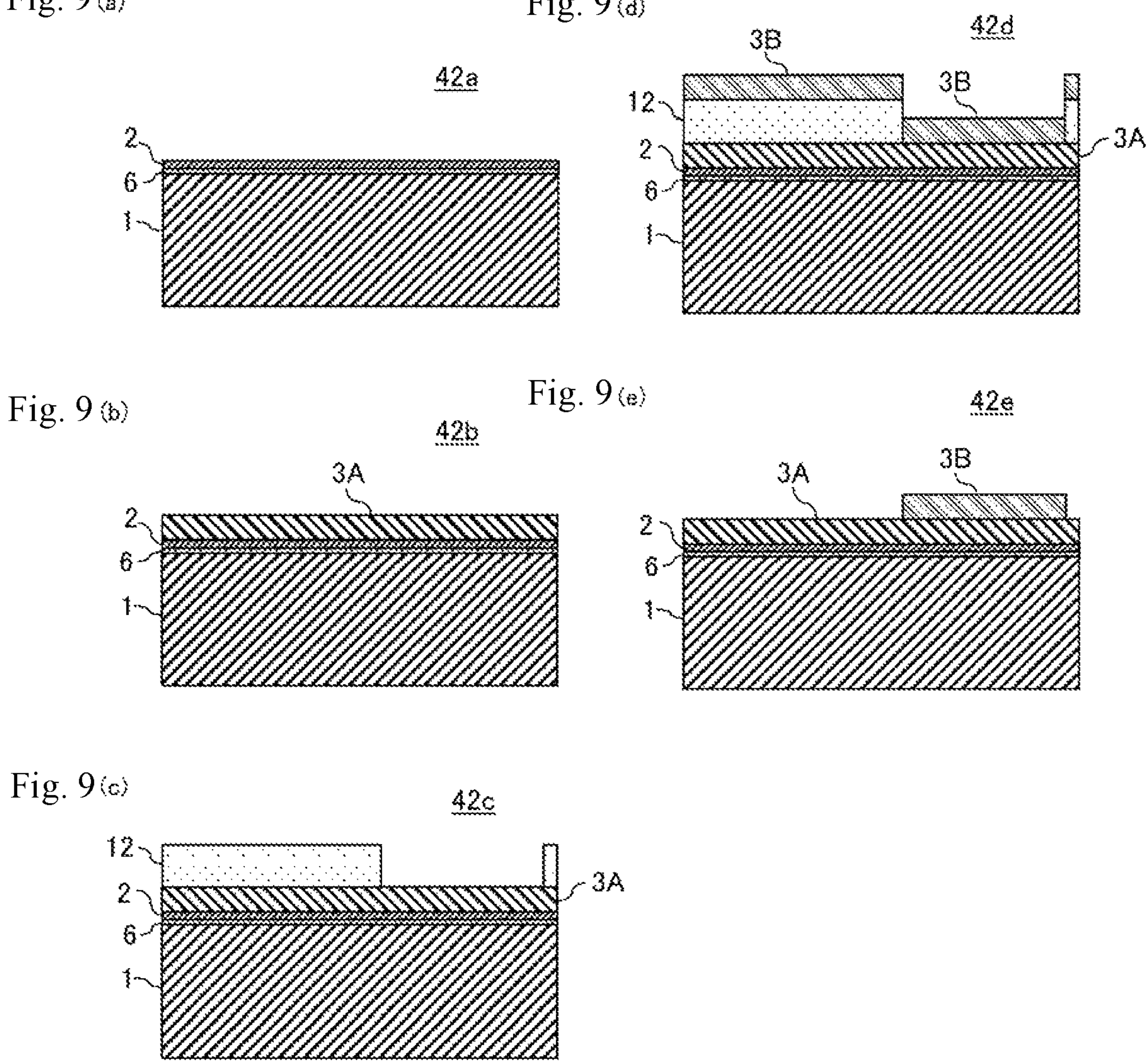
FIG. 9(*a*) is a view illustrating an example of a cross-sectional structure of a stack 42*a* before depositing an output-side piezoelectric film, FIG. 9(*b*) is a view illustrating an example of a cross-sectional structure of a stack 42*b* after depositing the output-side piezoelectric film, FIG. 9(*c*) is a view illustrating an example of a cross-sectional structure of a stack 42*c* after depositing a protective film, FIG. 9(*d*) is a view illustrating an example of a cross-sectional structure of a stack 42*d* after depositing an input-side piezoelectric film, and FIG. 9(*e*) is a view illustrating an example of a cross-sectional structure of a stack 42*e* after removing the protective film.

A method of manufacturing the piezoelectric stack 42 illustrated in FIG. 8 will be described, with reference to FIGS. 9(*a*) to 9(*e*).

The substrate 1 is firstly prepared, and an adhesion layer 6 (Ti-layer) and the bottom electrode film 2 are deposited in this order on any one of the main surfaces of the substrate 1 by, for example, the sputtering method, using a procedure and conditions similar to those in the above embodiment. As a result, a stack 42*a* as illustrated in FIG. 9(*a*) is obtained.

Subsequently, the KNN-film 3A is deposited using a procedure and conditions similar to those in the above embodiment. As a result, a stack 42*b* as illustrated in FIG. 9(*b*) is obtained. After that, the protective film 12 is deposited on the KNN-film 3A using a procedure and conditions similar to those in the above embodiment. Then, the protective film 12 is shaped into a predetermined pattern. For example, the protective film 12 is removed by etching or the like from a position on the substrate 1 where the AlN-film 3B is to be deposited, i.e., a position on the KNN-film 3A. As a result, a stack 42*c* as illustrated in FIG. 9(*c*) is obtained. Then, the AlN-film 3B is deposited using a procedure and conditions similar to those in the above embodiment. As a result, a stack 42*d* as illustrated in FIG. 9(*d*) is obtained. After that, the protective film 12 is removed using a procedure and conditions similar to those in the above embodiment. As a result, a predetermined area of the KNN-film 3A is exposed. Also, using the protective film 12 as a lift-off layer, an unnecessary AlN-film 3B formed on the protective film 12 is also removed. That is, the AlN-film 3B is left only in a region where the AlN-film 3B is to be deposited. As a result, a stack 42*e* as illustrated in FIG. 9(*e*) is obtained. After that, the top electrode films 4A and 4B are deposited using a procedure and conditions similar to those in the above embodiment. As a result, the piezoelectric stack 42 as illustrated in FIG. 8 is obtained.

Other configurations can be similar to those in the above embodiment and modified examples. The present modified example can also provide effects similar to those of the above embodiment and modified examples. That is, in the present modified example as well, the ultrasonic sensor 30 having the high performance can be obtained, and such an ultrasonic sensor 30 can be collectively produced in the MEMS manufacturing process. The inventors have confirmed that the input part can detect the vibration of the input-side vibration part with a high sensitivity even when the AlN-film 3B is provided on the KNN-film 3A as in the present modified example.

The present modified example is not limited to the aspect illustrated in FIG. 8. For example, the bottom electrode film 2 illustrated in FIG. 8 may function as the bottom electrode film 2A, and the bottom electrode film 2B having configurations similar to those in the modified example 1 may be provided between the KNN-film 3A and the AlN-film 3B.

Modified Example 4

In the above embodiment, explanation has been given for an example of depositing the AlN-film 3B after depositing the KNN-film 3A, but the present disclosure is not limited to such an aspect. That is, the KNN-film 3A may be deposited after depositing the AlN-film 3B.

In the present modified example, the protective film 12 is deposited in such a manner as covering the AlN-film 3B, after depositing the AlN-film 3B and before depositing the KNN-film 3A, using a procedure and conditions similar to those in the above embodiment. Then, the protective film 12 is shaped into a predetermined pattern by removing the protective film 12 by etching or the like from a position on the substrate 1 (bottom electrode film 2) where the KNN-film 3A is to be deposited. The KNN-film 3A is then deposited using a procedure and conditions similar to those in the above embodiment. After the deposition of the KNN-film 3A is complete, the protective film 12 is removed using a procedure and conditions similar to those in the above embodiment. As a result, the AlN-film 3B is exposed and the unnecessary KNN-film 3A formed on the protective film 12 is removed. Thus, in the present modified example, the protective film 12 functions as a lift-off layer for removing the unnecessary KNN-film 3A.

Other configurations can be similar to those in the embodiment and modified examples. The present modified example can also provide effects similar to those of the above embodiment and the like. That is, in the present modified example as well, the ultrasonic sensor 30 having the high performance can be obtained, and such an ultrasonic sensor 30 can be collectively produced in the MEMS manufacturing process.

Modified Example 5

Figure 10:
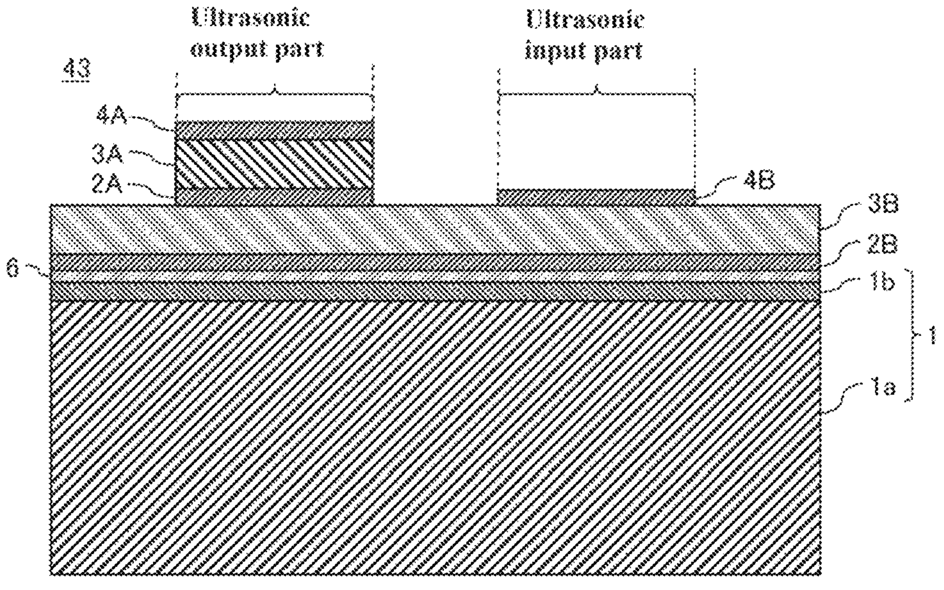
FIG. 10 is a view illustrating a cross-sectional structure of a piezoelectric stack according to a modified example of an embodiment of the present disclosure.

As illustrated in FIG. 10, a piezoelectric stack 43 may include the substrate 1, the bottom electrode film 2B provided on the substrate 1, the input-side piezoelectric film (AlN-film) 3B provided on the bottom electrode film 2B, the output-side bottom electrode film 2A provided on the input-side piezoelectric film 3B, the output-side piezoelectric film (KNN-film) 3A provided on the output-side bottom electrode film 2A, the top electrode film 4A provided on the output-side piezoelectric film 3A, and the top electrode film 4B provided on the input-side piezoelectric film 3B.

In the present modified example, the output part includes a stacked part of the bottom electrode film 2A, the KNN-film 3A, and the top electrode film 4A. The output part may include portions of the bottom electrode film 2B and the AlN-film 3B which are located under the KNN-film 3A. Also, the input part includes a stacked part of the bottom electrode film 2B, the AlN-film 3B, and the top electrode film 4B.

Other aspects can be similar to the aspects in the above embodiment and modified examples. The present modified example can also provide effects similar to those of the above embodiment and modified examples. That is, in the present modified example as well, the ultrasonic sensor 30 having the high performance can be obtained, and such an ultrasonic sensor 30 can be collectively produced in the MEMS manufacturing process.

Also, in the present modified example, the bottom electrode film 2A is provided on the AlN-film 3B, and the KNN-film 3A is provided on the bottom electrode film 2A. Thereby, in the present modified example as well, since the KNN-film 3A is deposited directly on the bottom electrode film 2A, i.e., directly on the Pt-film, the crystals constituting the KNN-film 3A are easily preferentially oriented in (001) direction. However, the bottom electrode film 2A may not be provided. That is, the configurations of the bottom electrode film 2B may be similar to the configurations of the bottom electrode film 2 in the above embodiment, and the bottom electrode film 2 may function as the output-side bottom electrode film 2A and also function as the input-side bottom electrode film 2B.

Modified Example 6

A substrate on which a semiconductor circuit such as CMOS is deposited, can also be used as the substrate 1. In a case where the KNN-film 3A is deposited on the substrate 1 on which the circuit such as CMOS is formed, from a viewpoint of suppressing a breakdown of the semiconductor circuit such as CMOS, the KNN-film 3A is preferably deposited under a condition of a temperature less than 500° C., and more preferably higher than or equal to the deposition temperature of the AlN-film 3B and less than 500° C. By depositing the KNN-film 3A under the condition of the temperature less than 500° C., the breakdown of the semiconductor circuit formed on the substrate 1 can be suppressed during the deposition of the KNN-film 3A. By depositing the KNN-film 3A under the condition of the temperature higher than or equal to the deposition temperature of the AlN-film 3B, even in a case where the AlN-film 3B is deposited after depositing the KNN-film 3A as in the above embodiment, the reduction of the KNN-film 3A can be reliably suppressed in the deposition atmosphere of the AlN-film 3B. The inventors have confirmed that even when the KNN-film 3A is deposited at a low temperature of less than 500° C., the KNN-film 3A having the piezoelectric constant of 100 pm/V or more can be obtained.

Other aspects can be similar to the aspects in the above embodiment and modified examples. The present modified example can also provide effects similar to those of the above embodiment and the like. That is, in the present modified example as well, the ultrasonic sensor 30 having the high performance can be obtained, and such an ultrasonic sensor 30 can be collectively produced in the MEMS manufacturing process.

Modified Example 7

The output part and the input part may be in contact with each other. Since the output-side vibration part and the input-side vibration part are formed independently with each other, it is possible to prevent the output-side vibration part and the input-side vibration part from interfering with each other. In the present modified example as well, the ultrasonic sensor 30 having the high performance can be obtained, and such an ultrasonic sensor 30 can be produced collectively in the MEMS manufacturing process. However, from a viewpoint of reliably preventing the output part and the input part from interfering, and reliably suppressing the deterioration in the sensor performance of the ultrasonic sensor 30, the output part and the input part are preferably not in contact with each other.

Modified Example 8

In the above embodiment, explanation has been given for a case where the AlN-film 3B is a polycrystalline film of AlN, but the AlN-film 3B may be a single-crystal film of AlN. The present modified example can also provide effects similar to those of the above embodiment and modified examples.

Other Embodiments

As described above, explanation has been given specifically for the embodiments of the present disclosure. However, the present disclosure is not limited thereto, and can be variously modified without departing from the gist of the disclosure.

In the above embodiment and modified examples, explanation has been given for a case where the output-side piezoelectric film 3A is the KNN-film, but the present disclosure is not limited thereto. The output-side piezoelectric film 3A may also be deposited using, in place of KNN, a compound which contains lead (Pb), zirconium (Zr), and titanium (Ti), and which is represented by a composition formula $Pb(Zr_{1-x}Ti_x)O_3$ (0<x<1). That is, the output-side piezoelectric film 3A can be deposited using lead-zirconium-titanium oxide (PZT). The output-side piezoelectric film 3A can also be deposited using a compound which contains bismuth (Bi), Na, and Ti, and which is represented by a composition formula $(Bi_{1-x}Na_x)TiO_3$ (0<x<1). That is, the output-side piezoelectric film 3A can also be deposited using bismuth sodium titanium oxide (BNT). Moreover, the output-side piezoelectric film 3A can also be deposited using a compound represented by a composition formula $BiFeO_3$, i.e., using bismuth ferrite (BFO). Even when the output-side piezoelectric film 3A is deposited using PZT, BNT, or BFO, effects similar to those of the above embodiment and the like can be obtained. That is, the ultrasonic sensor 30 having the high performance can be obtained, and such an ultrasonic sensor 30 can be collectively produced in the MEMS manufacturing process.

In the above embodiment and modified examples, explanation has been given for a case where the input-side piezoelectric film 3B is the AlN-film, but the present disclosure is not limited thereto. The input-side piezoelectric film 3B may be another nitride film exhibiting the piezoelectric performance equivalent to that of the AlN-film.

For example, the output-side piezoelectric film 3A may contain, in addition to or in place of the above metal elements such as Cu and Mn, other metal element having effects equivalent to those of the above metal element, at a predetermined concentration.

In the above embodiment, explanation has been given for a case of using the piezoelectric stack 10 and the piezoelectric element 20 to obtain the ultrasonic sensor 30, but the present disclosure is not limited thereto. The piezoelectric stack 10 and piezoelectric element 20 may be used to obtain a piezoelectric device module used for applications such as a head for an inkjet printer, a MEMS mirror for a scanner, an angular velocity sensor, a pressure sensor, or an acceleration sensor.

PREFERABLE ASPECTS OF PRESENT DISCLOSURE

Preferable aspects of the present disclosure will be supplementarily described hereinafter.

Supplementary Description 1

According to an aspect of the present disclosure, there is provided a piezoelectric stack, including:

a substrate;
an output-side bottom electrode film on the substrate;
an output-side piezoelectric film, being an oxide film, on the output-side bottom electrode film;
an output-side top electrode film on the output-side piezoelectric film;
an input-side bottom electrode film on the substrate;
an input-side piezoelectric film, being a nitride film, on the input-side bottom electrode film;
an input-side top electrode film on the input-side piezoelectric film; and
an ultrasonic output part and an ultrasonic input part are placed in such a manner as not overlapping each other when viewed from a top surface of the substrate,
the ultrasonic output part including a stacked part of the output-side bottom electrode film, the output-side piezoelectric film, and the output-side top electrode film,
the ultrasonic input part including a stacked part of the input-side bottom electrode film, the input-side piezoelectric film, and the input-side top electrode film.

Supplementary Description 2

Preferably, there is provided the piezoelectric stack according to the supplementary description 1, wherein the ultrasonic output part and the ultrasonic input part are not in contact with each other.

Supplementary Description 3

Preferably, there is provided the piezoelectric stack according to the supplementary description 1 or 2, wherein the output-side piezoelectric film has a larger piezoelectric constant than that of the input-side piezoelectric film, and the input-side piezoelectric film has a lower dielectric constant than that of the output-side piezoelectric film.

Supplementary Description 4

Preferably, there is provided the piezoelectric stack according to any one of the supplementary descriptions 1 to 3, wherein the output-side piezoelectric film, being a deposited film, contains any one of potassium sodium niobium oxide, lead-zirconium-titanium oxide, bismuth sodium titanium oxide, or bismuth ferrite.

Supplementary Description 5

Preferably, there is provided the piezoelectric stack according to any one of the supplementary descriptions 1 to 4, wherein the output-side piezoelectric film, being a deposited film, contains potassium sodium niobium oxide, and contains at least one selected from a group of Cu and Mn at a concentration of 0.2 at % or more and 2.0 at % or less relative to an amount of niobium in the output-side piezoelectric film.

Supplementary Description 6

Preferably, there is provided the piezoelectric stack according to any one of the supplementary descriptions 1 to 5, wherein the input-side piezoelectric film, being a deposited film, contains aluminum nitride.

Supplementary Description 7

Preferably, there is provided the piezoelectric stack according to the supplementary description 6, wherein the input-side piezoelectric film contains scandium (Sc), contains magnesium (Mg) and zirconium (Zr), or contains magnesium (Mg) and hafnium (Hf).

Supplementary Description 8

Preferably, there is provided the piezoelectric stack according to any one of the supplementary descriptions 1 to 7, further including: a semiconductor circuit on the substrate.

Supplementary Description 9

According to another aspect of the present disclosure, there is provided a method of manufacturing a piezoelectric stack, including:

depositing an output-side bottom electrode film and an input-side bottom electrode film on a substrate;

depositing an output-side piezoelectric film, being an oxide film, on the output-side bottom electrode film;

depositing a protective film that protects the output-side piezoelectric film;

depositing an input-side piezoelectric film, being a nitride film, on the input-side bottom electrode film;

exposing the output-side piezoelectric film by removing the protective film by etching; and depositing an output-side top electrode film on the output-side piezoelectric film and depositing an input-side top electrode film on the input-side piezoelectric film, thereby producing a stack in which an ultrasonic output part and an ultrasonic input part are placed in such a manner as not overlapping each other when viewed from a top surface of the substrate, the ultrasonic output part including a stacked part of the output-side bottom electrode film, the output-side piezoelectric film, and the output-side top electrode film, the ultrasonic input part including a stacked part of the input-side bottom electrode film, the input-side piezoelectric film, and the input-side top electrode film.

Supplementary Description 10

Preferably, there is provided the method according to the supplementary description 9, wherein the protective film is a film containing silicon dioxide ($SiO_2$).

Supplementary Description 11

Preferably, there is provided the method according to the supplementary description 9 or 10, wherein a substrate including a semiconductor circuit is prepared as the substrate, and in the deposition of the output-side piezoelectric film, the output-side piezoelectric film is deposited under a condition of a temperature less than 500° C. Preferably, in the deposition of the output-side piezoelectric film, the output-side piezoelectric film is deposited under a condition of a temperature higher than or equal to a deposition temperature of the input-side piezoelectric film in the deposition of the input-side piezoelectric film and less than 500° C.

Supplementary Description 12

According to further another aspect of the present disclosure, there is provided a piezoelectric element and an ultrasonic sensor, each including:

the piezoelectric stack according to any one of the supplementary descriptions 1 to 8;

a voltage applicator connected between the output-side bottom electrode film and the output-side top electrode film; and a voltage detector connected between the input-side bottom electrode film and the input-side top electrode film, wherein the output-side piezoelectric film deforms under a voltage application from the voltage applicator applying a predetermined electric field between the output-side bottom electrode film and the output-side top electrode film, and ultrasonic waves generated due to a deformation of the output-side piezoelectric film are transmitted from the ultrasonic output part, and the ultrasonic input part receives the ultrasonic waves reflected by a test object, and a voltage generated between the input-side bottom electrode film and the input-side top electrode film due to a deformation of the input-side piezoelectric film is detected by the voltage detector.

Supplementary Description 13

Preferably, there is provided the element according to the supplementary description 12, further including: a vibration part (e.g., a membrane structure or a cantilever structure) on the substrate at each of positions corresponding to the ultrasonic output part and corresponding to the ultrasonic input part.

DESCRIPTION OF SIGNS AND NUMERALS

1 Substrate
2A Output-side bottom electrode film
2B Input-side bottom electrode film
3A Output-side piezoelectric film (KNN-film)
3B Input-side piezoelectric film (AlN-film)
4A Output-side top electrode film
4B Input-side top electrode film
10, 40 to 43 Piezoelectric stack

The invention claimed is:

1. A piezoelectric element comprising:

a substrate;

an output-side bottom electrode film on the substrate;

an output-side piezoelectric film, being an oxide film, on the output-side bottom electrode film;

an output-side top electrode film on the output-side piezoelectric film;

an input-side bottom electrode film on the substrate;

an input-side piezoelectric film, being a nitride film, on the input-side bottom electrode film;

an input-side top electrode film on the input-side piezoelectric film; and an ultrasonic output part and ultrasonic input part placed in such a manner as not overlapping each other when viewed from a top surface of the substrate, the output-side piezoelectric film is separated from the input-side piezoelectric film by a gap, the ultrasonic output part comprising a stacked part of the output-side bottom electrode film, the output-side piezoelectric film, and the output-side top electrode film, the ultrasonic input part comprising a stacked part of the input-side bottom electrode film, the input-side piezoelectric film, and the input-side top electrode film.

2. The piezoelectric element according to claim 1, wherein the ultrasonic output part and the ultrasonic input part are not in contact with each other.

3. The piezoelectric element according to claim 1, wherein the output-side piezoelectric film, being a deposited film, contains any one of potassium sodium niobium oxide, lead-zirconium-titanium oxide, bismuth sodium titanium oxide, or bismuth ferrite.

4. The piezoelectric element according to claim 1, wherein the input-side piezoelectric film, being a deposited film, contains aluminum nitride.

5. A method of manufacturing the piezoelectric element according to claim 1, comprising:

depositing the output-side bottom electrode film and the input-side bottom electrode film on the substrate;

depositing the output-side piezoelectric film, being an oxide film, on the output-side bottom electrode film;

depositing a protective film that protects the output-side piezoelectric film;

depositing the input-side piezoelectric film, being a nitride film, on the input-side bottom electrode film;

exposing the output-side piezoelectric film by removing the protective film by etching; and depositing the output-side top electrode film on the output-side piezoelectric film and depositing the input-side top electrode film on the input-side piezoelectric film, thereby producing a stack in which the ultrasonic output part and the ultrasonic input part are placed in such a manner as not overlapping each other when viewed from the top surface of the substrate, the ultrasonic output part comprising the stacked part of the output-side bottom electrode film, the output-side piezoelectric film, and the output-side top electrode film, the ultrasonic input part comprising the stacked part of the input-side bottom electrode film, the input-side piezoelectric film, and the input-side top electrode film.

6. The method of manufacturing the piezoelectric element according to claim 5, wherein the protective film is any one of a film containing silicon dioxide, a film containing lanthanum nickel oxide, or a film containing strontium ruthenium oxide.

7. The piezoelectric element according to claim 1, further comprising:

a voltage applicator connected between the output-side bottom electrode film and the output-side top electrode film; and a voltage detector connected between the input-side bottom electrode film and the input-side top electrode film, wherein the output-side piezoelectric film deforms under a voltage application from the voltage applicator applying a predetermined electric field between the output-side bottom electrode film and the output-side top electrode film, and ultrasonic waves generated due to a deformation of the output-side piezoelectric film are transmitted from the ultrasonic output part, and the ultrasonic input part receives the ultrasonic waves reflected by a test object, and a voltage generated between the input-side bottom electrode film and the input-side top electrode film due to a deformation of the input-side piezoelectric film is detected by the voltage detector.

8. The piezoelectric element according to claim 2, wherein the output-side piezoelectric film, being a deposited film, contains any one of potassium sodium niobium oxide, lead-zirconium-titanium oxide, bismuth sodium titanium oxide, or bismuth ferrite.

9. The piezoelectric element according to claim 2, wherein the input-side piezoelectric film, being a deposited film, contains aluminum nitride.

10. The piezoelectric element stack according to claim 3, wherein the input-side piezoelectric film, being a deposited film, contains aluminum nitride.

11. The piezoelectric element according to claim 2, further comprising:

a voltage applicator connected between the output-side bottom electrode film and the output-side top electrode film; and a voltage detector connected between the input-side bottom electrode film and the input-side top electrode film, wherein the output-side piezoelectric film deforms under a voltage application from the voltage applicator applying a predetermined electric field between the output-side bottom electrode film and the output-side top electrode film, and ultrasonic waves generated due to a deformation of the output-side piezoelectric film are transmitted from the ultrasonic output part, and the ultrasonic input part receives the ultrasonic waves reflected by a test object, and a voltage generated between the input-side bottom electrode film and the input-side top electrode film due to a deformation of the input-side piezoelectric film is detected by the voltage detector.

12. The piezoelectric element according to claim 3, further comprising:

a voltage applicator connected between the output-side bottom electrode film and the output-side top electrode film; and a voltage detector connected between the input-side bottom electrode film and the input-side top electrode film, wherein the output-side piezoelectric film deforms under a voltage application from the voltage applicator applying a predetermined electric field between the output-side bottom electrode film and the output-side top electrode film, and ultrasonic waves generated due to a deformation of the output-side piezoelectric film are transmitted from the ultrasonic output part, and the ultrasonic input part receives the ultrasonic waves reflected by a test object, and a voltage generated between the input-side bottom electrode film and the input-side top electrode film due to a deformation of the input-side piezoelectric film is detected by the voltage detector.

13. The piezoelectric element according to claim 4, further comprising:

a voltage applicator connected between the output-side bottom electrode film and the output-side top electrode film; and a voltage detector connected between the input-side bottom electrode film and the input-side top electrode film, wherein the output-side piezoelectric film deforms under a voltage application from the voltage applicator applying a predetermined electric field between the output-side bottom electrode film and the output-side top electrode film, and ultrasonic waves generated due to a deformation of the output-side piezoelectric film are transmitted from the ultrasonic output part, and the ultrasonic input part receives the ultrasonic waves reflected by a test object, and a voltage generated between the input-side bottom electrode film and the input-side top electrode film due to a deformation of the input-side piezoelectric film is detected by the voltage detector.

* * * * *